(12) United States Patent
Tachino et al.

(10) Patent No.: US 8,134,690 B2
(45) Date of Patent: Mar. 13, 2012

(54) LIGHT DETECTING DEVICE AND METHOD OF CONTROLLING LIGHT DETECTING DEVICE

(75) Inventors: Yoshihide Tachino, Okazaki (JP); Ryoichi Sugawara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 118 days.

(21) Appl. No.: 12/778,407

(22) Filed: May 12, 2010

(65) Prior Publication Data

US 2010/0290028 A1 Nov. 18, 2010

(30) Foreign Application Priority Data

May 13, 2009 (JP) ................................. 2009-116682

(51) Int. Cl.
*G01C 3/08* (2006.01)
(52) U.S. Cl. ................. 356/4.01; 257/E27.15
(58) Field of Classification Search ........ 356/4.01–5.15; 257/222, E27.15; 250/214 R
See application file for complete search history.

(56) References Cited

U.S. PATENT DOCUMENTS

| | | | |
|---|---|---|---|
| 6,400,448 B1* | 6/2002 | Sugawara et al. | 356/5.01 |
| 7,750,285 B2* | 7/2010 | Nagamune et al. | 250/214.1 |
| 7,876,422 B2* | 1/2011 | Hashimoto et al. | 356/4.07 |
| 7,910,964 B2* | 3/2011 | Kawahito et al. | 257/292 |
| 2004/0129864 A1* | 7/2004 | Yamagishi | 250/214 R |
| 2004/0195493 A1* | 10/2004 | Hashimoto et al. | 250/214 R |
| 2006/0192938 A1 | 8/2006 | Kawahito | |
| 2007/0103748 A1 | 5/2007 | Hashimoto et al. | |
| 2011/0187908 A1* | 8/2011 | Kawahito et al. | 348/306 |

* cited by examiner

*Primary Examiner* — Isam Alsomiri
(74) *Attorney, Agent, or Firm* — Posz Law Group, PLC

(57) ABSTRACT

A light detecting device includes a well region, a first holding region disposed in a surface portion of the well region, a second holding region and a third holding region disposed in a surface portion of the first holding region, an insulating layer disposed on the second holding region and the third holding region, a first electrode disposed on the second holding region through the insulating layer, and the second electrode disposed on the third holding region through the insulating layer. The first holding region is configured to hold a first carrier generated in the well region. Each of the second holding region and the third holding region is configured to hold a second carrier generated in the well region. The first carrier is one of an electron and a hole, and the second carrier is the other one of the electron and the hole.

16 Claims, 21 Drawing Sheets

FIG. 15A
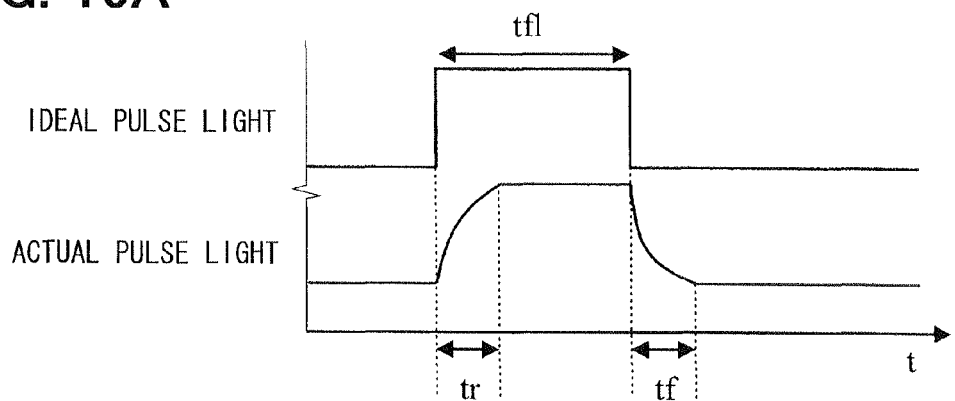
FIG. 15B
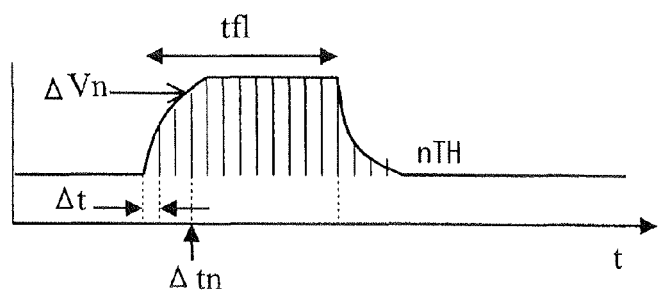
FIG. 15C
|  | Δt0 | Δt1 | Δt2 | ... | Δtn-1 | Δtn |
|---|---|---|---|---|---|---|
| IDEAL VALUE | A0 | A1 | A2 | ... | An-1 | An |
| ACTUAL VALUE | B0 | B1 | B2 | ... | Bn-1 | Bn |
| COMPENSATION COEFFICIENT Xa | A0/B0 | A1/B1 | A2/B2 | ... | An-1/Bn-1 | An/Bn |

LIGHT DETECTING DEVICE AND METHOD OF CONTROLLING LIGHT DETECTING DEVICE

CROSS REFERENCE TO RELATED APPLICATIONS

The present application is based on and claims priority to Japanese Patent Application No. 2009-116682 filed on May 13, 2009, the contents of which are incorporated in their entirety herein by reference.

BACKGROUND OF THE INVENTION

1. Field of the Invention

The present invention relates to a light detecting device and a method of controlling a light detecting device.

2. Description of the Related Art

Conventionally, a photo transistor and a charge-coupled device/complementary metal-oxide semiconductor (CCD/CMOS) image sensor are used as a light detecting device. The light detecting device may be used, for example, as an image sensor in a video camera and a digital camera for reading out the intensity of a detected light as a change in voltage. The light detecting device may also be used as an optical communication apparatus using light as transmission media. The light detecting device may also used as a sensor in an image data generating apparatus that generates range image data by arranging pixel values in accordance with a distance to a detected object using an active light.

The range image is an image in which a distance to a detected object is expressed with light and shade (pixel values). By using the range image, distances to respective objects within a large area can be detected at one time.

When the light detecting device detects a signal light caused by a light source, that is, when the light detecting device is used, for example, for a perimeter monitoring sensor, an infrared ray communication, or a distance sensor for a robot vision, an outside light enters in addition to the signal light caused by the light source. In the above-described case, the intensity of detected light is increases by the intensity of the outside light. Therefore, it is difficult to detect the intensity of the signal light with accuracy.

In the light detecting device, charges corresponding to the amount of the detected light are generated and are stored. However, there are limitations to the amount of changes that can be stored, and the stored charges may be saturated with increase in the amount of the detected light. Thus, when a high-intensity outside light enters in addition to the signal light, the light detecting device may be saturated only by the outside light, and the signal light may not be read out.

Furthermore, in a case where the intensity of the outside light fluctuates with time, the intensity of the detected light also fluctuates. As a result, a component corresponding to the signal light and a component corresponding to the outside light cannot be separated. A method for separating a component corresponding to a signal light and a component corresponding to an outside light from a light detection signal of a light detecting device is disclosed, for example, in US 2006/0192938 A1 (corresponding to JP-A-2004-294420) and US 2007/0103748 A1 (corresponding to JP-A-2005-303268).

In the method disclosed in US 2006/0192938 A1, a light source is intermittently turned on, difference between a light detection signal during a light-on time and a light detection signal during a light-off time is calculated, and thereby a component corresponding to the outside light is removed. In other words, in a short time in which the intensity of the outside light does not change, the light detection signal during the light-off time including only the component corresponding to the outside light is subtracted from the light detection signal during the light-on time including a component corresponding to the light signal and the component corresponding to the outside light. As a result, the ratio of the component corresponding to the outside light can be increased by reducing the ratio of the component corresponding to the outside light.

In the invention disclosed in US 2006/0192938 A1, at least two charge storing nodes are required for one light detecting device in order to detect difference in phases of the signal light and the light source. Thus, the dimension of a process circuit in a pixel circuit increases.

In addition, another charge storing node is also required in order to store the charges due to the outside light, separate the component corresponding to the signal light and the component corresponding to the outside light, and remove the component corresponding to the outside light. Thus, the dimension of the process circuit in the pixel circuit further increases. As a result, the number of transistors included in one pixel increases, and the light detecting signal is difficult to be used for a high-pixel device.

Furthermore, in order to remove the influence of the outside light, at least two output operations, that is, an output operation of the light detection signal during the light-on time including the component corresponding to the signal light and the component corresponding to the outside light and an output operation of the light detection signal during the light-off time including only the component corresponding to the outside light. Thus, a response time required to detect the light detection signal corresponding to the signal light increases.

In a case where a weak signal such as a reflected signal from a long distance or a reflected signal from a black object or an object having a low reflectivity is treated, an integral time of the light detecting device may be increased in order to increase the amount of detected light. In this case, the response time required to detecting the light detection signal corresponding to the signal light further increases. Furthermore, a time-lag of the light detection signal of the component corresponding to the outside light may increase, and the intensity of the outside light may fluctuate. As a result, it may be difficult to remove the component corresponding to the outside light with accuracy.

In order to the remove the component corresponding to the outside light efficiently, each of the charge storing nodes must not be saturated. The detected charges are transferred to each of the charge storing nodes and the light detection signal at the time is read out as a voltage value. When a high-intensity light enters, the charge storing nodes may be saturated after the charges are transferred, and a light detection signal having incorrect voltage may be read out. As a result, in the outside light greater than the saturation limit of each of the charge storing nodes, it is difficult to detect the component corresponding to the signal light.

In the method disclosed in US 2007/0103748 A1, electrons and holes are separately stored in a light detecting device as target carriers and non-target carriers. Then, a component corresponding to an outside light is removed by selectivity recombining difference between a light-on time and a light-off time. In the method, charges can be cancelled as pairs of electron and hole, and the component corresponding to the outside light can be removed before reading out of the light detecting device. Thus, a component corresponding to the signal light can be detected while restricting saturation due to the outside light, and a dynamic range for light can be improved.

In the light detecting device, various operations such as holding, discharging, and recombining of electrons and holes can be performed by controlling control electrodes in a light detecting part in order to restrict saturation of charge storing nodes.

During the light-off time of the light source, charges due to the outside light are divided into electrons and holes, and the electrons and the holes are separately held. Next, only the electrons are discharged. During the light-on time of the light source, charges due to the signal light and the outside light are divided into electrons and holes, and the electrons and the holes are separately held. Then, the electrons and the holes are recombined, and the remaining charges are transferred as a signal light component to the charge storing node. Thus, the light detecting device can output the signal light component in which an outside light component is not included.

In order to use the remaining charges after recombination as the signal light component, the light detecting device needs to be configured so that a ratio of electrons and holes generated by light to be 2:1. The ratio of the electrons and the holes depends on a structure of an element (for example, a positional relationship, shapes, dimensions, and impurity concentrations of an electron holding region and a hole holding region) and a difference in motilities of the electrons and the holes. Thus, the ratio of the electrons and the holes depends on an accuracy of a manufacturing process.

A height of a potential barrier and a depth of a potential well depend on an arrangement of the control electrodes for controlling the electrons and the holes and a voltage applied to the control electrodes. The ratio of the electrons and the holes generated by a light changes with the height of the potential barrier and the depth of the potential well. Thus, it is difficult to actually control the ratio of the electrons and the holes to be 2:1 in the light detecting device.

Furthermore, since the light detecting device has a complicated structure, the light detecting device cannot be formed without a special process. Thus, the manufacturing process may become complicated, development costs and develop time may increase, and a competitiveness may be reduced. In addition, since it is difficult for a manufacturer without own process to tune up the light detecting device, a growth of a market is restricted.

SUMMARY OF THE INVENTION

In view of the foregoing problems, it is an object of the present invention to provide a light detecting device that can restrict saturation of a storing node due to an outside light and can extract only a component corresponding to a signal light. Another object of the present invention is to provide a method of controlling the light detecting device.

A light detecting device according to a first aspect of the present invention includes a semiconductor substrate, an element forming region, a well region, a first holding region, a second holding region, a third holding region, a storing region, a discharging region, an insulating layer, a first control electrode, a second control electrode, a transferring electrode, a discharging electrode, and a resetting electrode. The semiconductor substrate has a first conductivity type. The element forming region is disposed on a surface of the semiconductor substrate and has the first conductivity type. The well region is disposed in a surface portion of the element forming region and has a second conductivity type. The first holding region is disposed in a surface portion of the well region. The first holding region has the second conductivity type and is configured to hold a first carrier generated in the well region. The first carrier is one of an electron and a hole. The second holding region and a third holding region are disposed in a surface portion of the first holding region. Each of the second holding region and the third holding region has the first conductivity type. Each of the second holding region and the third holding region is configured to hold a second carrier generated in the well region. The second carrier is the other one of the electron and the hole. The storing region is disposed in the surface portion of the element forming region. The storing region has the second conductivity type and is configured to store the first carrier. The discharging region is disposed in the surface portion of the element forming region. The discharging region has the second conductivity type and is configured to be used for discharging the first carrier. The insulating layer is light-permeable and is disposed on the second holding region and the third holding region. The first control electrode is light-permeable. The first control electrode is disposed on the second holding region through the insulating layer and is configured to control holding of the second carrier in the second holding region. The second control electrode is light-permeable. The second control electrode is disposed on the third holding region through the insulating layer and is configured to control holding of the second carrier in the third holding region. The transferring electrode is in contact with the well region and the storing region and is configured to control transferring of the first carrier or the second carrier between the well region and the storing region. The discharging electrode is in contact with the well region and the discharging region and is configured to control transferring of the first carrier or the second carrier between the well region and the discharging region. The resetting electrode is in contact with the storing region and the discharging region and is configured to control transferring of the first carrier and the second carrier between the storing region and the discharging region.

The light detecting device according to the first aspect can restrict saturation of the storing region due to an outside light and can extract only a component corresponding to a signal light.

According to a second aspect of the present invention, in a method of controlling the light detecting device according to the first aspect, the first control electrode and the second control electrode are controlled so that in a plurality of first carriers and a plurality of second carriers generated in the well region during a light-off time of a light source, the plurality of first carriers is held in the first holding region and the plurality of second carriers is divided equally between the second holding region and the third holding region. Then, the discharging electrode is reversed so that the plurality of first carriers is completely discharged from the first holding region to the discharging region, and the discharging electrode is reversed again. Next, the first control electrode and the second control electrode are controlled so that in a plurality of first carriers and a plurality of second carriers generated in the well region during a light-on time of the light source, the plurality of first carriers is held in the first holding region and the plurality of second carriers is equally divided between the second holding region and the third holding region. Only one of the first control electrode and the second control electrode is reversed so that a part of the plurality of first carriers held in the first holding region recombine with the plurality of second carriers held in one of the second holding region and the third holding region on which the one of the first control electrode and the second control electrode is disposed. The transferring electrode is reversed so that the other part of the plurality of first carriers remaining in the first holding region is completely transferred from the first holding region to the storing region. A light detection signal is output in accordance with the other part of the plurality of first carriers stored in the storing region.

The method according to the second aspect can restrict saturation of the storing region due to an outside light and can output the light detection signal in accordance with an intensity of a signal light.

According to a third aspect of the present invention, in a method of controlling the light detecting device according to the first aspect, a light-off time and a light-on time of a light source are set to have a same time length. The same voltage is applied to the first control electrode and the second control electrode so that in a plurality of first carriers and a plurality of second carriers generated in the well region during the light-off time in accordance with an intensity of an outside light, the plurality of first carriers is held in the first holding region and the plurality of second carriers is divided equally between the second holding region and the third holding region. A voltage applied to the discharging electrode is reversed so that the plurality of first carriers is completely discharged from the first holding region to the discharging region, and the voltage applied to the discharging electrode is reversed again. Next, the same voltage is applied to the first control electrode and the second control electrode so that in a plurality of first carriers and a plurality of second carriers generated in the well region during the light-on time in accordance with the intensity of the outside light and the intensity of the light source, the plurality of first carriers is held in the first holding region and the plurality of second carriers is divided equally between the second holding region and the third holding region. The voltage applied to only one of the first control electrode and the second control electrode is reversed so that a part of the plurality of first carriers held in the first holding region during the light-on time in accordance with the intensity of the outside light and the intensity of the light source recombine with the plurality of second carriers held in one of the second holding region and the third holding region, on which the one of the first electrode and the second electrode is disposed, during the light-off time and the light-on time in accordance with the intensity of the outside light and the intensity of the light source, and a half of the plurality of first carriers that is generated during the light-on time in accordance with the intensity of the light source remains in the first holding region. A voltage applied to the transferring electrode is reversed so that the half of the plurality of first carriers remaining in the first holding region is completely transferred from the first holding region to the storing region. A light detection signal is output in accordance with the half of the plurality of first carriers stored in the storing region.

The method according to the third aspect can restrict saturation of the storing region due to the outside light and can output the light detection signal in accordance with the intensity of the light source.

According to a fourth aspect of the present invention, a method of controlling an apparatus including a pair of the light detecting devices according to the first aspect is provided. The pair of the light detecting devices includes a first light detecting device and a second light detecting device arranged next to each other. The method of controlling the apparatus includes a method in a distance measurement mode for measuring a distance from a light source to an object. In the method in the distance measurement mode, the same voltage is applied to the first electrode and the second electrode in the first light detecting device so that in a plurality of first carriers and a plurality of second carriers generated in the well region during a first light-off time of the light source in accordance with an intensity of an outside light, the plurality of first carriers is held in the first holding region and the plurality of second carriers is divided equally between the second holding region and the third holding region. A voltage applied to the discharging electrode in the first light detecting device is reversed so that the plurality of first carriers is completely discharged from the first holding region to the discharging region, and the voltage applied to the discharging electrode in the first light detecting device is reversed again. Next, a pulse light is irradiated from the light source in a first light-on time. The same voltage is applied to the first control electrode and the second control electrode in the first light detecting device so that in a plurality of first carriers and a plurality of second carriers generated in the well region during the first light-on time in accordance with the intensity of the outside light and an intensity of a reflected light of the pulse signal from the object, the plurality of first carriers is held in the first holding region and the plurality of second carriers is divided equally between the second holding region and the third holding region. The voltage applied to only one of the first control electrode and the second control electrode in the first light detecting device is reversed so that a part of the plurality of first carriers held in the first holding region during the first light-on time in accordance with the intensity of the outside light and the intensity of the reflected light recombine with the plurality of second carriers held in one of the second holding region and the third holding region, on which the one of the first electrode and the second electrode is disposed, during the first light-off time and the first light-on time in accordance with the intensity of the outside light and the intensity of the reflected light, and a half of the plurality of first carriers that is generated during the first light-on time in accordance with the intensity of the reflected light remains in the first holding region. A voltage applied to the transferring electrode in the first light detecting device is reversed so that the half of the plurality of first carriers remaining in the first holding region is completely transferred from the first holding region to the storing region. A first light detection signal is output in accordance with the half of the plurality of first carriers stored in the storing region. Furthermore, the same voltage is applied to the first electrode and the second electrode in the second light detecting device so that in a plurality of first carriers and a plurality of second carriers generated in the well region during a second light-off time of the light source in accordance with the intensity of the outside light, the plurality of first carriers is held in the first holding region and the plurality of second carriers is divided equally between the second holding region and the third holding region. A voltage applied to the discharging electrode in the second light detecting device is reversed so that the plurality of first carriers is completely discharged from the first holding region to the discharging region, and the voltage applied to the discharging electrode in the second light detecting device is reversed again. The pulse light is irradiated from the light source in a second light-on time. The same voltage is applied to the first control electrode and the second control electrode in the second light detecting device so that in a plurality of first carriers and a plurality of second carriers generated in the well region during the second light-on time in accordance with the intensity of the outside light and the intensity of the reflected light, the plurality of first carriers is held in the first holding region and the plurality of second carriers is divided equally between the second holding region and the third holding region. The voltage applied to only one of the first control electrode and the second control electrode in the second light detecting device is reversed so that a part of the plurality of first carriers held in the first holding region during the second light-on time in accordance with the intensity of the outside light and the intensity of the reflected light recombine with the plurality of second carriers held in one of the second holding region and the third holding region, on which the one of the first electrode and the second electrode is disposed, during the second light-off time and the second the light-on time in accordance with the intensity of the outside light and the intensity of the reflected light, and a half of the plurality of first carriers that is generated during the second light-on time in accordance with the intensity of the reflected light remains in the first holding region. The voltage applied to the transferring electrode in the second light detecting device is reversed so that the half of the plurality of first carriers remaining in the first holding region is completely transferred from the first holding region to the storing region. A second light detection signal is output in accordance with the half of the plurality of first carriers stored in the storing region. The distance from the light source to the object is calculated based on the first light detection signal and the second light detection signal.

The method according to the third aspect can restrict saturation of the storing region due to the outside light and can calculate the distance from the light source to the object based on the first light detection signal and the second light detection signal that are output in accordance with the intensity of the reflected light.

BRIEF DESCRIPTION OF THE DRAWINGS

Additional objects and advantages of the present invention will be more readily apparent from the following detailed description of exemplary embodiments when taken together with the accompanying drawings. In the drawings:

FIG. 15A is a diagram showing a waveform of an ideal pulse light and a waveform of an actual pulse light, FIG. 15B is a diagram showing a predetermined time Δt, FIG. 15C is a diagram showing an example of a compensation coefficient table;

DETAILED DESCRIPTION OF THE EXEMPLARY EMBODIMENTS

First Embodiment

Figure 1:
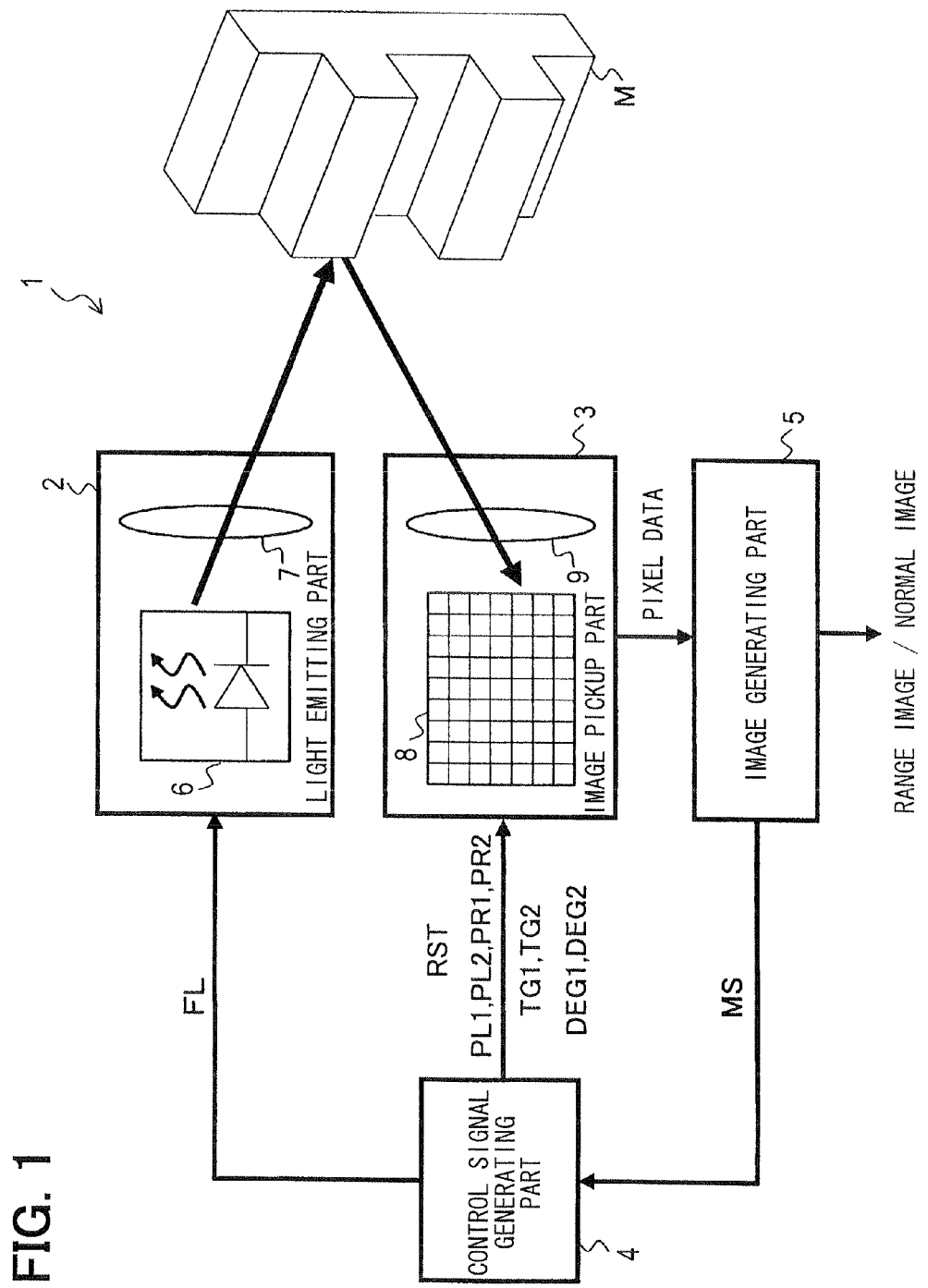
FIG. 1 is a block diagram showing an image generating apparatus according to a first embodiment of the present invention.

An image generating apparatus 1 including a light detecting device 200 according to a first embodiment of the present invention will be described with reference to FIG. 1.

The image generating apparatus 1 picks up an image of an object M and generates a range image. The image generating apparatus 1 includes a light emitting part 2, an image pickup part 3, a control signal generating part 4, and an image generating part 5. The light emitting part 2 emits a frequency-modulated signal based on a light emitting signal FL. The image pickup part 3 picks up an image within a measurement area based on transfer signals TG and discharge signals DEG. The control signal generating part 4 outputs the light emitting signal FL, four independent hold signals PL1, PL2, PR1, and PR2, two independent transfer signals TG1 and TG2, and two independent discharge signals DEG1 and DEG2 through respective lines. The control signal generating part 4 controls starting times and durations of the light emitting signal FL, the transfer signals TG1 and TG2, and the discharge signals DEG1 and DEG2 on a pixel to pixel basis. The image generating part 5 generates a range image or a normal image based on a pixel data from the image pickup part 3. The image generating part 5 also generates a mode switching signal MS for selectively switching a distance measurement mode and an image pickup mode.

The light emitting part 2 includes a light emitting diode (LED) or a laser diode (LD) that generates a near-infrared light. The light emitting part 2 includes a light emitting element 6 and a diffusing lens 7. The light emitting element 6 is driven based on the light emitting signal FL. The diffusing lens 7 diffuses a light emitted by the light emitting element 6 and irradiates the measurement area.

Figure 2:
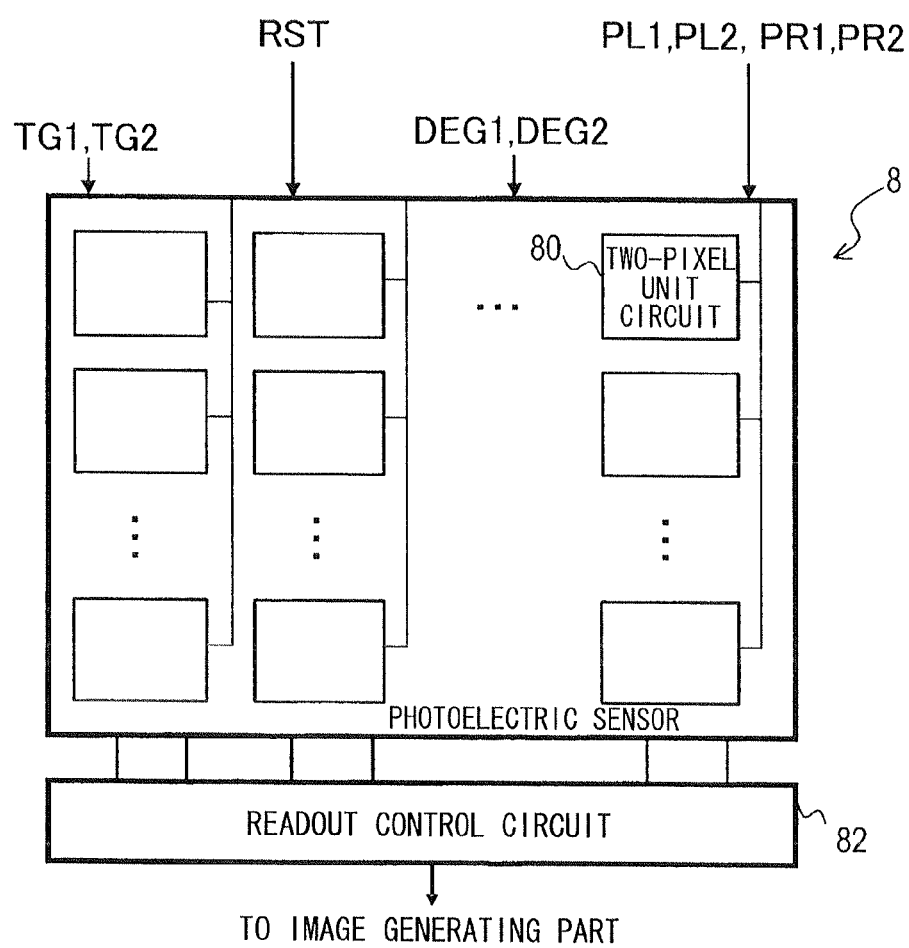
FIG. 2 is a diagram showing an image pickup part in the image generating apparatus according to the first embodiment.
Figure 3:
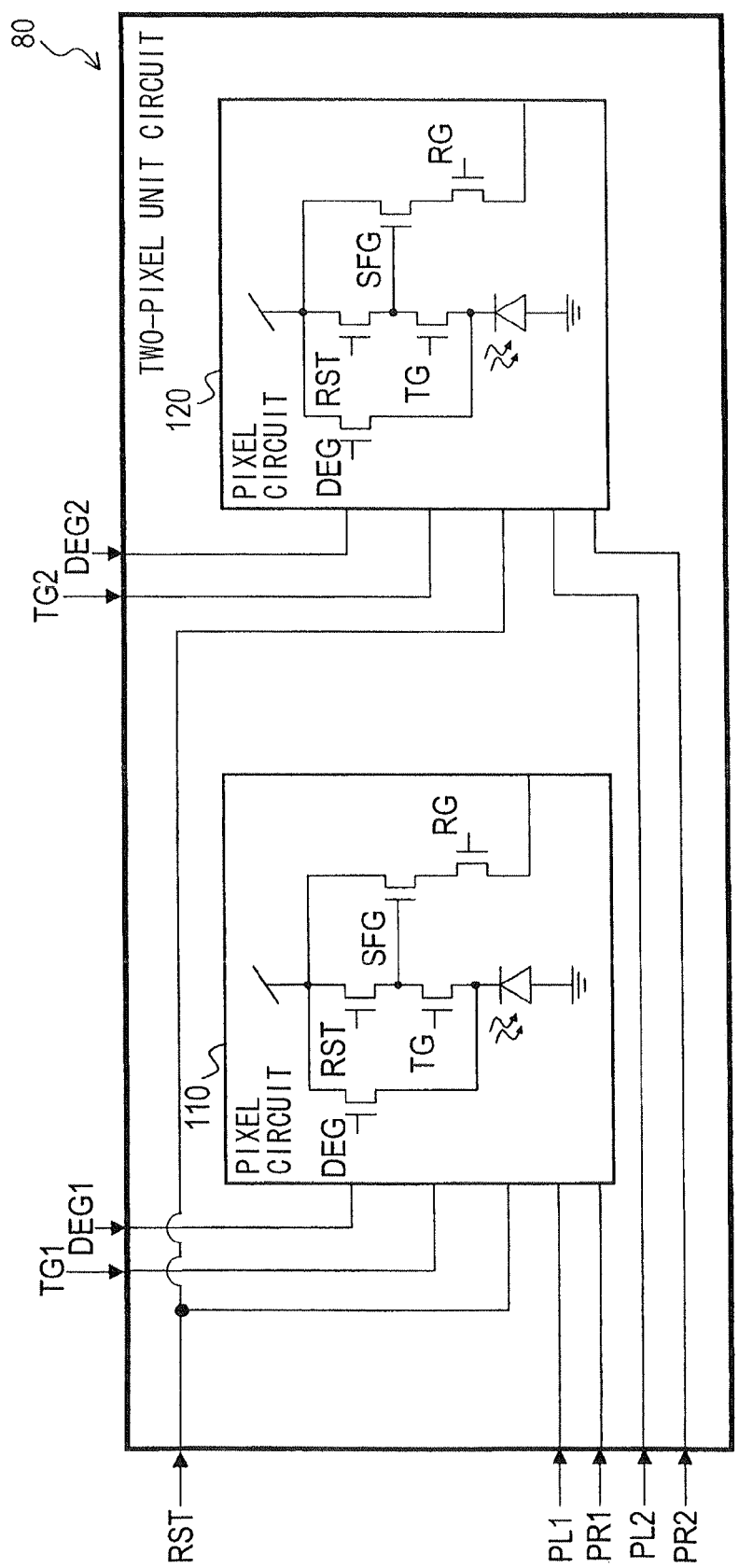
FIG. 3 is a circuit diagram showing a two-pixel unit circuit in the image pickup part.
Figure 4:
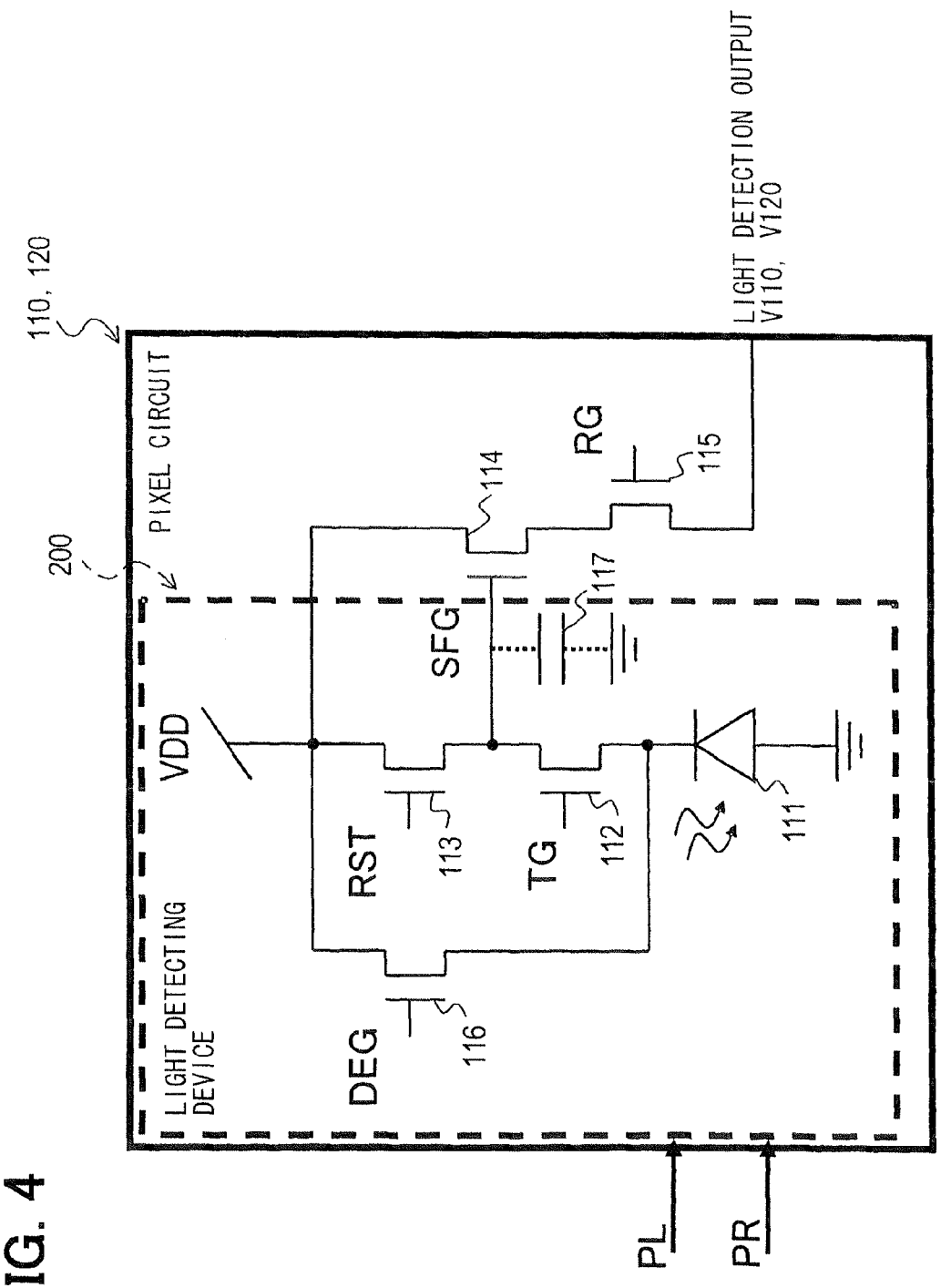
FIG. 4 is a circuit diagram showing a pixel circuit in the two-pixel unit circuit.

The image pickup part 3 includes a photoelectric sensor 8 and condensing lens 9. The photoelectric sensor 8 converts an incident light to an electric signal. The condensing lens 9 condenses a light from the measurement area so that the light enters the photoelectric sensor 8. As shown in FIG. 2 to FIG. 4, the photoelectric sensor 8 includes a plurality of two-pixel unit circuits 80 and a readout control circuit 82. Each of the two-pixel unit circuits 80 includes two pixel circuits 110 and 120 as unit circuits. Each of the two-pixel unit circuits 80 has a light receiving surface, and the light reception surfaces of the two-pixel unit circuits 80 are arranged in an array. The readout control circuit 82 reads out a plurality of output signals from the two-pixel unit circuits 80 in order and supply the output signals to the image generating part 5.

As shown in FIG. 3, each of the two-pixel unit circuits 80 includes the two pixel circuits 110 and 120. The pixel circuits 110 and 120 have substantially the same configuration.

The pixel circuit 110 receives the two hold signals PL1 and PR1, the transfer signal TG1, and the discharge signal DEG1. The pixel circuit 120 receives the two hold signals PL2 and PR2, the transfer signal TG2, and the discharge signal DEG2. Thus, each of the pixel circuits 110 and 120 receives a set of the hold signals, the transfer signal, and the discharge signal independent of each other.

Since the pixel circuits 110 and 120 have substantially the same configuration, the configuration of the pixel circuit 110 will be described with reference to FIG. 4 on behalf of the pixel circuits 110 and 120.

As shown in FIG. 4, the pixel circuit 110 includes a photoelectric transducer 111, a transfer transistor 112, a reset transistor 113, a source follower transistor 114, a row select transistor 115, an exhaust transistor 116, and a floating diffusion 117. A cathode side of the photoelectric transducer 111 is coupled with the ground GND. An anode side of the photoelectric transducer 111 is coupled with a source of the transfer transistor 112. A drain of the transfer transistor 112 is coupled with a source of the reset transistor 113 and a gate of the source follower transistor 114. A drain of the reset transistor 113 and a drain of the source follower transistor are coupled with a power source having a voltage VDD. A source of the source follower transistor 114 is coupled with a drain of the row select transistor 115. An anode side of the photoelectric transducer 111 is also coupled with a source of the exhaust transistor 116. A drain of the exhaust transistor 116 is coupled with the power source having the voltage VDD. In the pixel circuit 110, a circuit shown by a dashed line in FIG. 4 provides the light detecting device 200.

Figure 5:
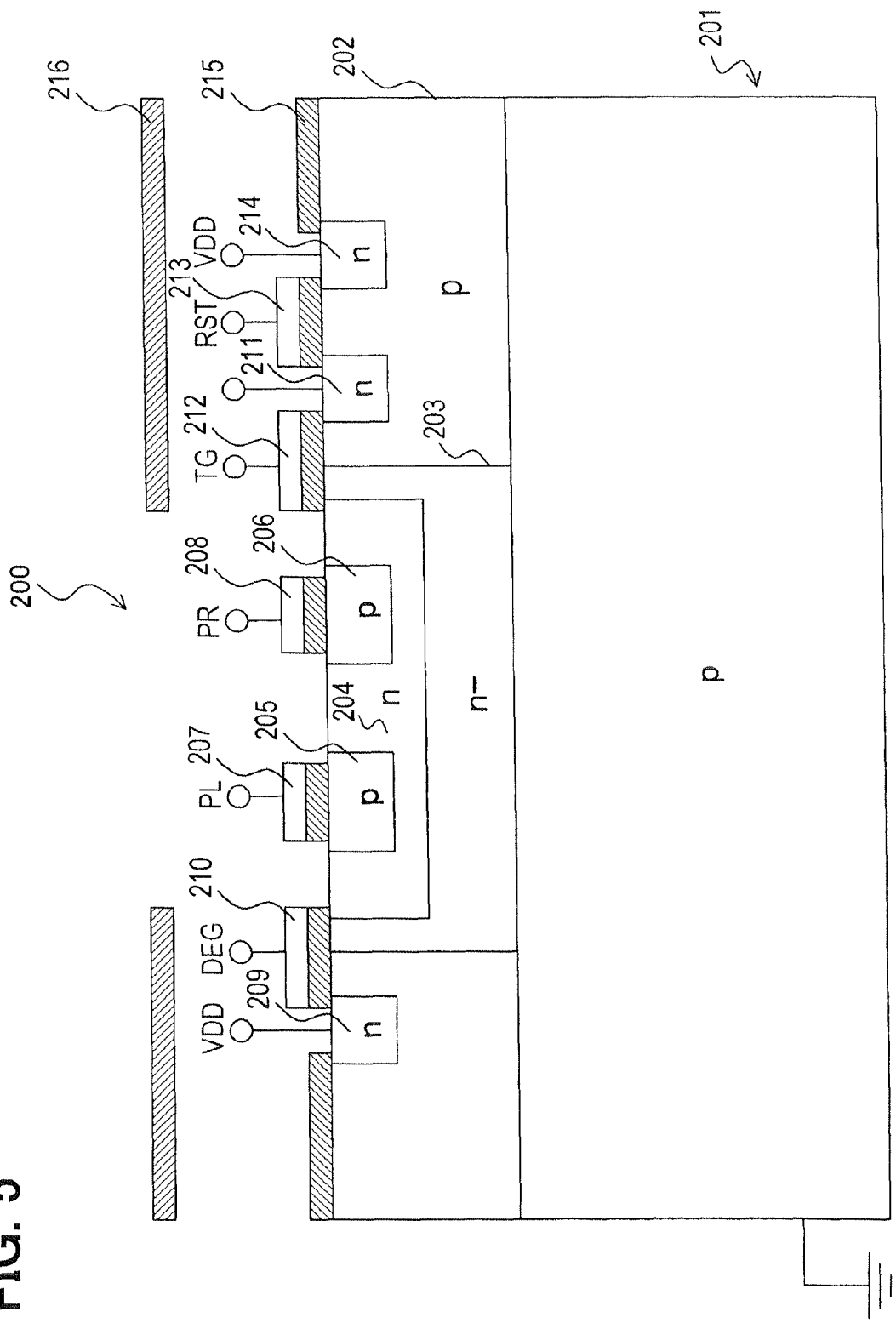
FIG. 5 is a cross-sectional view showing a light detecting device according to the first embodiment.

As shown in FIG. 5, the light detecting device 200 includes a substrate 201 of a P conductivity type. The substrate 200 is made a semiconductor such as silicon. On a surface of the substrate 201, an element forming region 202 of the P conductivity type is disposed. In a surface portion of the element forming region 202, a well region 203 of an N-conductivity type is disposed. The well region 203 may be in contact with the surface of the substrate 201. The element forming region 202 and the well region 203 have substantially the same thickness. In a surface portion of the well region 203, a first holding region 204 of an N conductivity type is disposed.

In a surface portion of the first holding region 204, a second holding region 205 of the P conductivity type and a third holding region 206 of the P conductivity type are disposed. The second holding region 205 and the third holding region 206 are equivalent. That is, the second holding region 205 and the third holding region 206 have the same dimension (for example, planar shape and width). On the second holding region 205 and the third holding region 206, a first control electrode 207 and a second control electrode 208 are disposed, respectively, through an insulating layer 215. The insulating layer 215 is made of an oxide layer such as a silicon oxide layer. The insulating layer 215 is light-permeable. The first control electrode 207 and the second control electrode 208 have the same dimension and are light-permeable. The first control electrode 207 is coupled with the line of the hold signal PL, and the second control electrode 208 is coupled with the line of the hold signal PR. Above the element forming region 202 except for the well region 203, a shielding layer 216 is disposed. Because the well region 203 is not covered with the shielding layer 216, the well region 203 can function as a light sensing part.

The whole configuration of the well region 203, the first holding region 204, the second holding region 205, the third holding region 206, the first control electrode 207 and the second control electrode 208 disposed through the insulating layer 215 corresponds to the photoelectric transducer 111 in FIG. 4.

In the surface portion of the element forming region 202 on one side of the well region 203, a drain region 209 of the N type conductivity is disposed. The drain region 209 can function as a discharging region. On a surface of the element forming region 202 between the well region 203 and the drain region 209, a discharging electrode 210 is disposed through the insulating layer 215. The discharging electrode 210 is in contact with the well region 203 and the drain region 209 through the insulating layer 215 and is configured to control transferring of electrons or holes between the well region 203 and the drain region 209. The discharging electrode 210 is coupled with the line of the discharge signal DEG. A surface of the drain region 209 is coupled with the power source having the voltage VDD through a contact. This configuration corresponds to the exhaust transistor 116 in FIG. 4.

In the surface portion of the element forming region 202 on the other side of the well region 203, a drain-source region of the N type conductivity is disposed. The drain-source region can function as a storing region 211. On a surface of the element forming region 202 between the well region 203 and the storing region 211, a transferring electrode 212 is disposed through the insulating layer 215. The transferring electrode 212 is in contact with the well region 203 and the storing region 211 through the insulating layer 215 and is configured to control transferring of electrons or holes between the well region 203 and the storing region 211. The transferring electrode 212 is coupled with the line of the transfer signal TG. This configuration corresponds to the transfer transistor 112 in FIG. 4.

In the surface portion of the element forming region 202 on one side of the storing region 211, a drain region 214 of the N conductivity type is disposed. The drain region 214 can function as discharging region. At a surface portion of the element forming region 202 between the storing region 211 and the drain region 214, a resetting electrode 213 is disposed through the insulating layer 215. The resetting electrode 213 is in contact with the storing region 211 and the drain region 214 through the insulating layer 215 and is configured to control transferring of electrons or holes between the storing region 211 and the drain region 214. The resetting electrode 213 is coupled with a line of the reset signal RST. A surface of the drain region 214 is coupled with the power source having the voltage VDD through the contact. This configuration corresponds to the reset transistor 113 in FIG. 4. The storing region 211 corresponds to the floating diffusion 117 in FIG. 4.

Although the drain region 209 and the drain region 214 are defined as separate regions for convenience, since the drain region 209 and the drain region 214 are coupled through the contact, the drain region 209 and the drain region 214 may be provided by one drain region for optimizing a device area.

In the above-described example, an N conductivity type element is formed on a P conductivity type semiconductor substrate. Alternatively, a P conductivity type element may be formed on an N type conductivity type semiconductor substrate.

Figure 6:
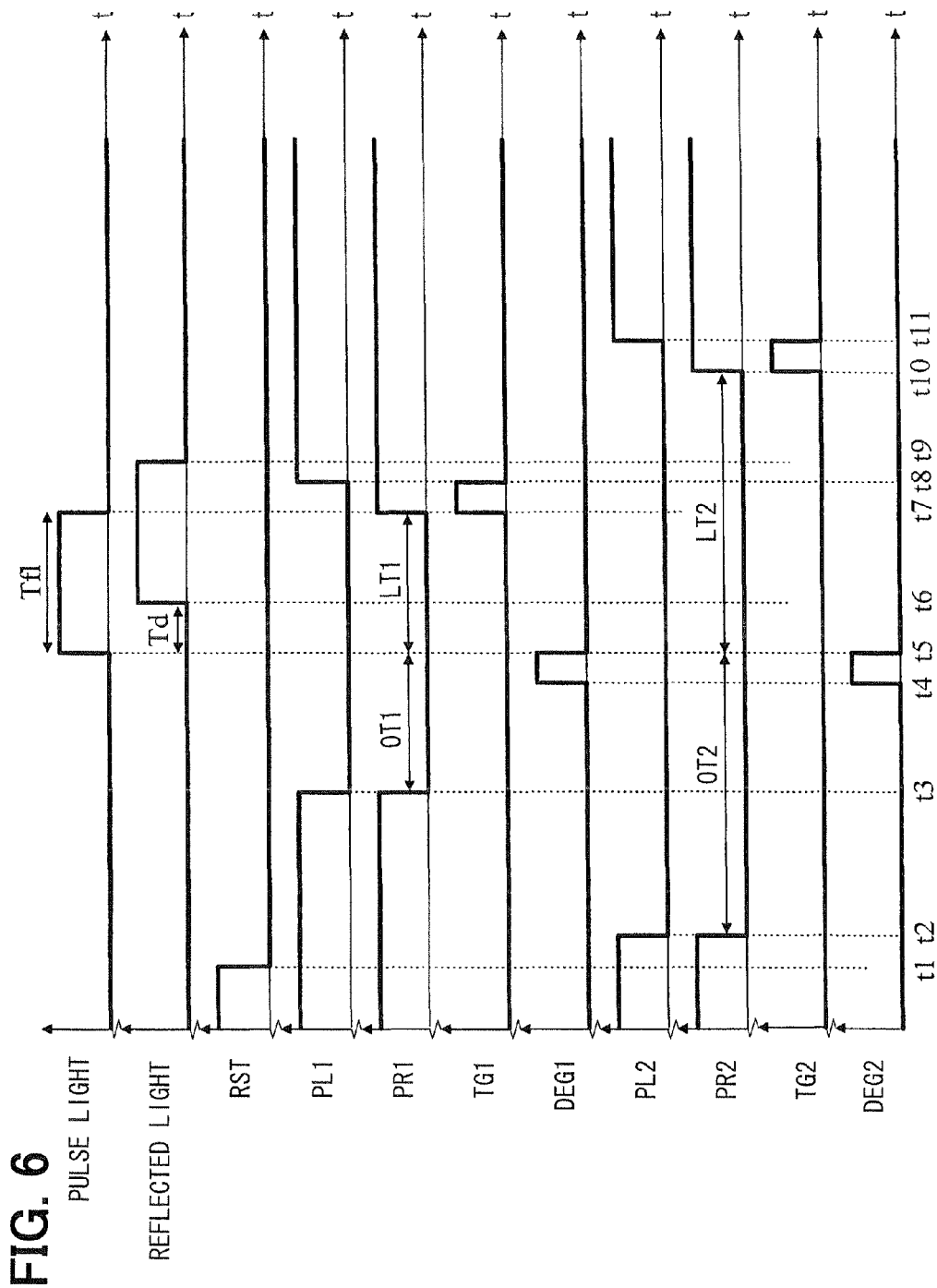
FIG. 6 is a timing chart showing signals output from a control signal generating part according to the first embodiment.

An operation of the image generating apparatus 1 according to the present embodiment will be described below. When the image generating apparatus 1 is in a distance measurement mode, the light emitting signal FL, the four independent hold signals PL1, PL2, PR1, and PR2, the two independent transfer signals TG1 and TG2, and two independent discharge signals DEG1 and DEG2 transition, for example, as shown in FIG. 6.

The light emitting part 2 irradiates a pulse light having a pulse width Tfl toward the object M based on the light emitting signal FL generated by the control signal generating part 4. Then, a reflected light returns after a delay of a time corresponding to a distance from a light source to the object M. Furthermore, an outside light steadily exist.

First, the reset signal RST and the hold signals PL1, PL2, PR1, and PR2 are set to active level (+), and the discharge signals DEG1, DEG2 and the transfer signals TG1, TG2 are set to an inactive level (−) so that an electric charge stored in the storing region 211 is reset to the voltage VDD. The reset signal RST may be commonly applied to the pixel circuits 110 and 120, or the reset signal RST may be independently applied to the pixel circuits 110 and 120.

Electrons generated in the first holding region 204 due to the outside light OL and holes generated in the second holding region 205 and the third holding region 206 due to the outside light OL immediately recombine and disappear because the hold signal PL1, PL2, PR1, and PR2 are at the active level.

At time t1, the reset signal RST is changed to the inactive level, and thereby the storing region 211 becomes a floating state. The reset signal RST is changed to the inactive level at the time t1 for convenience. The reset signal RST may also be reset to the voltage VDD just before the electrons are transferred from the first holding region 204.

Figure 7:
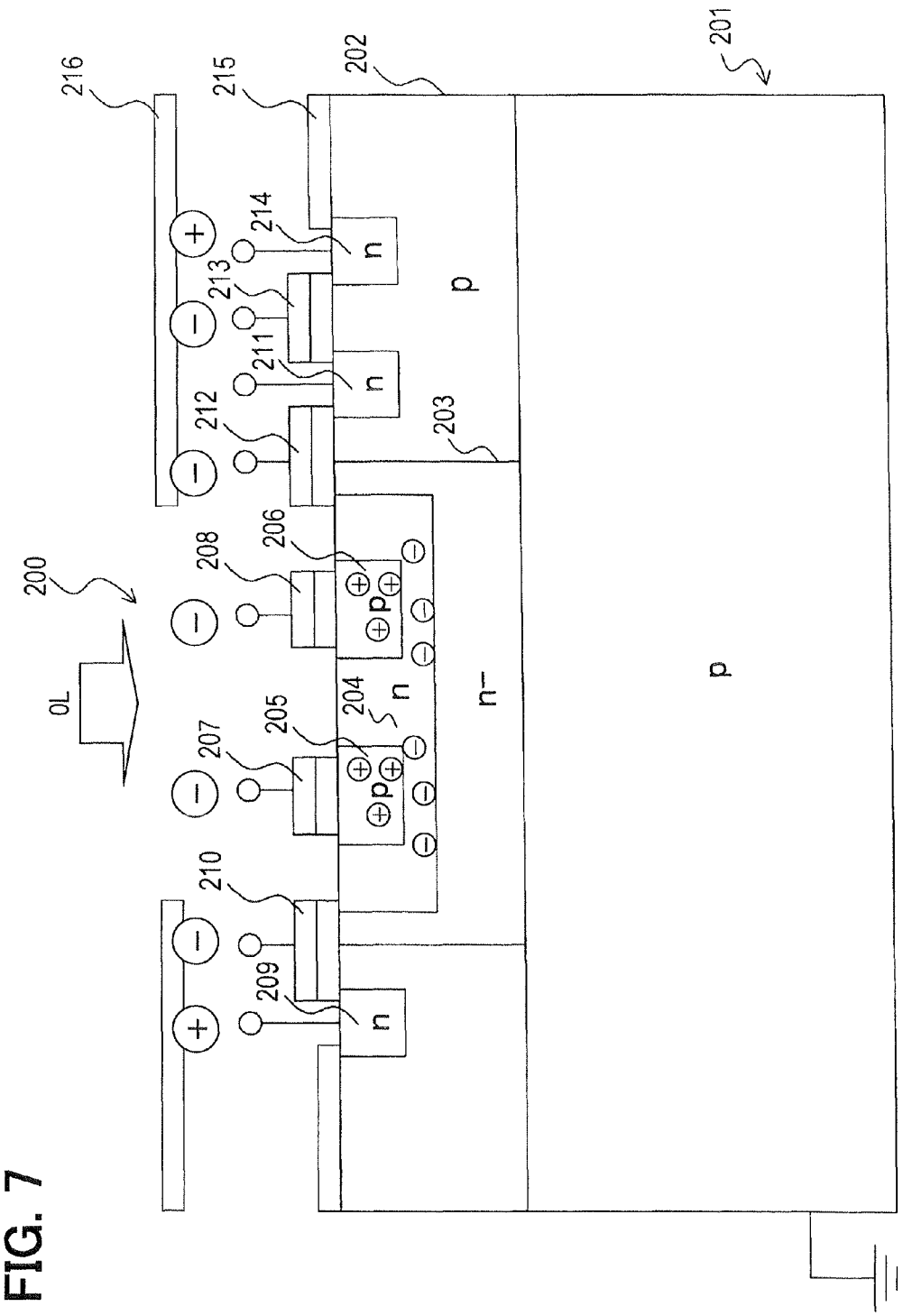
FIG. 7 is a diagram showing a state of the light detecting device according the first embodiment.

At time t2, the hold signals PL2 and PR2 input to the pixel circuit 120 are changed to the inactive level. Then, as shown in FIG. 7, holes are held in the second holding region 205 and the third holding region 206, and electrons are held in the first holding region 204 in accordance with the intensity of the outside light. A ratio of the number of the holes held in the second holding region 205, the number of the holes held in the third holding region 206, and the number of the electrons held in the first holding region 204 is 1:1:2.

At time t3, the hold signals PL1 and PR1 input to the pixel circuit 110 are changed to the inactive level. Then, holes are held in the second holding region 205 and the second hole holding 206, and electrons are held in the first holding region 204 in accordance with the intensity of the outside light. A ratio of the number of the holes held in the second holding region 205, the number of the holes held in the third holding region 206, and the number of the electrons held in the first holding region 204 is 1:1:2.

Figure 8:
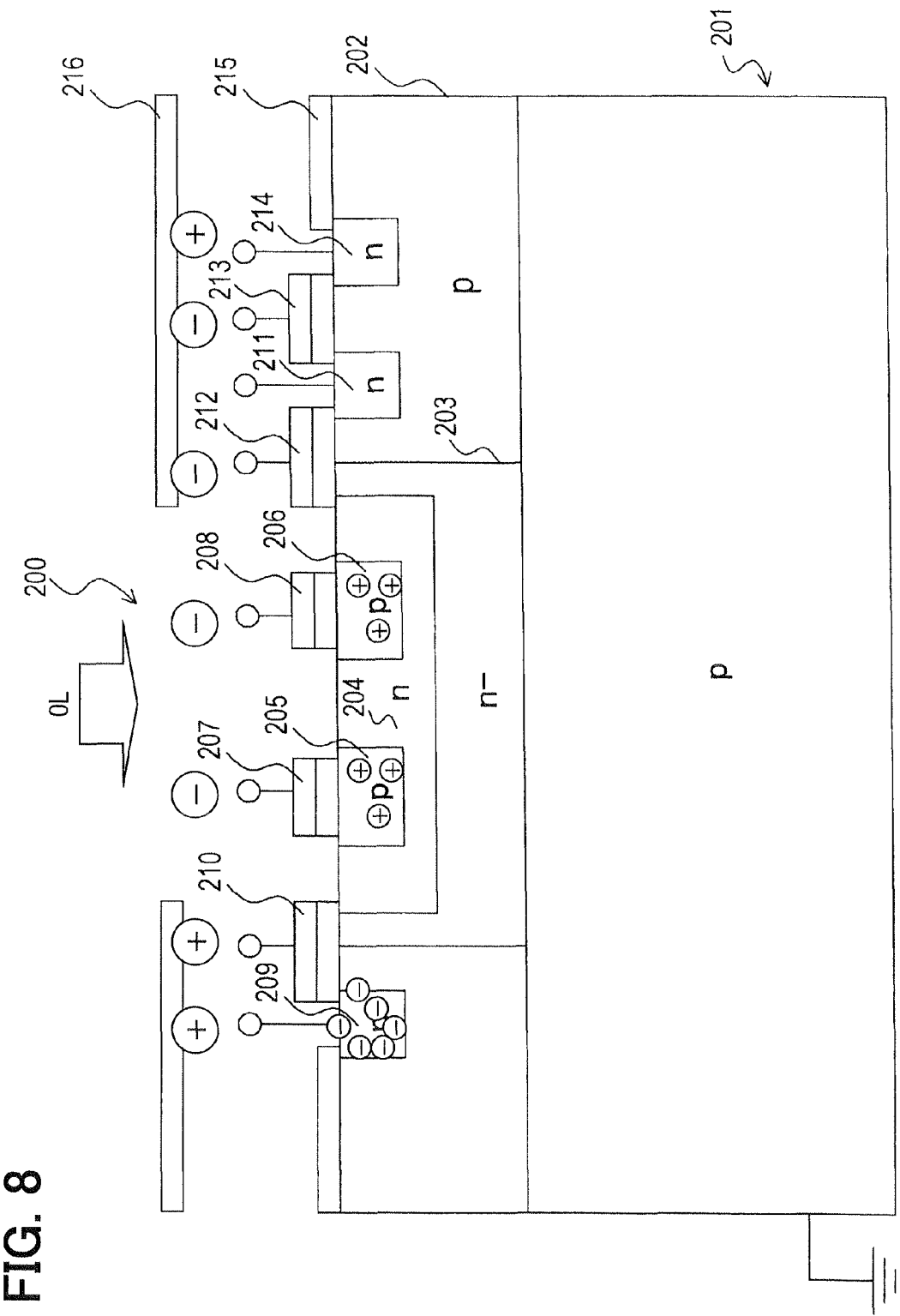
FIG. 8 is a diagram showing another state of the light detecting device according to the first embodiment.

At time t4, the discharge signals DEG1 and DEG2 input to the pixel circuits 110 and 120 are changed to the active level. Then, as shown in FIG. 8, the electrons held in the first holding region 204 in each of the pixel circuits 110 and 120 are discharged to the drain region 209 (discharging region) through a channel provided under the discharging electrode 210. The holes held in the second holding region 205 and the third holding region 206 in each of the pixel circuits 110 and 120 remain held and do not change.

At time t5, the discharge signals DEG1 and DEG2 input to the pixel circuits 110 and 120 are changed to the inactive level and thereby the discharge of the electrons held in each of the pixel circuits 110 and 120 is completed. Furthermore, by changing the light emitting signal FL to the active level, the light emitting part 2 starts to irradiate the pulse light. A time between the time t3 and the time t5 is defined as a first light-off time OT1, a time between the time t2 and the time t5 is defined as a second light-off time OT2.

Figure 9:
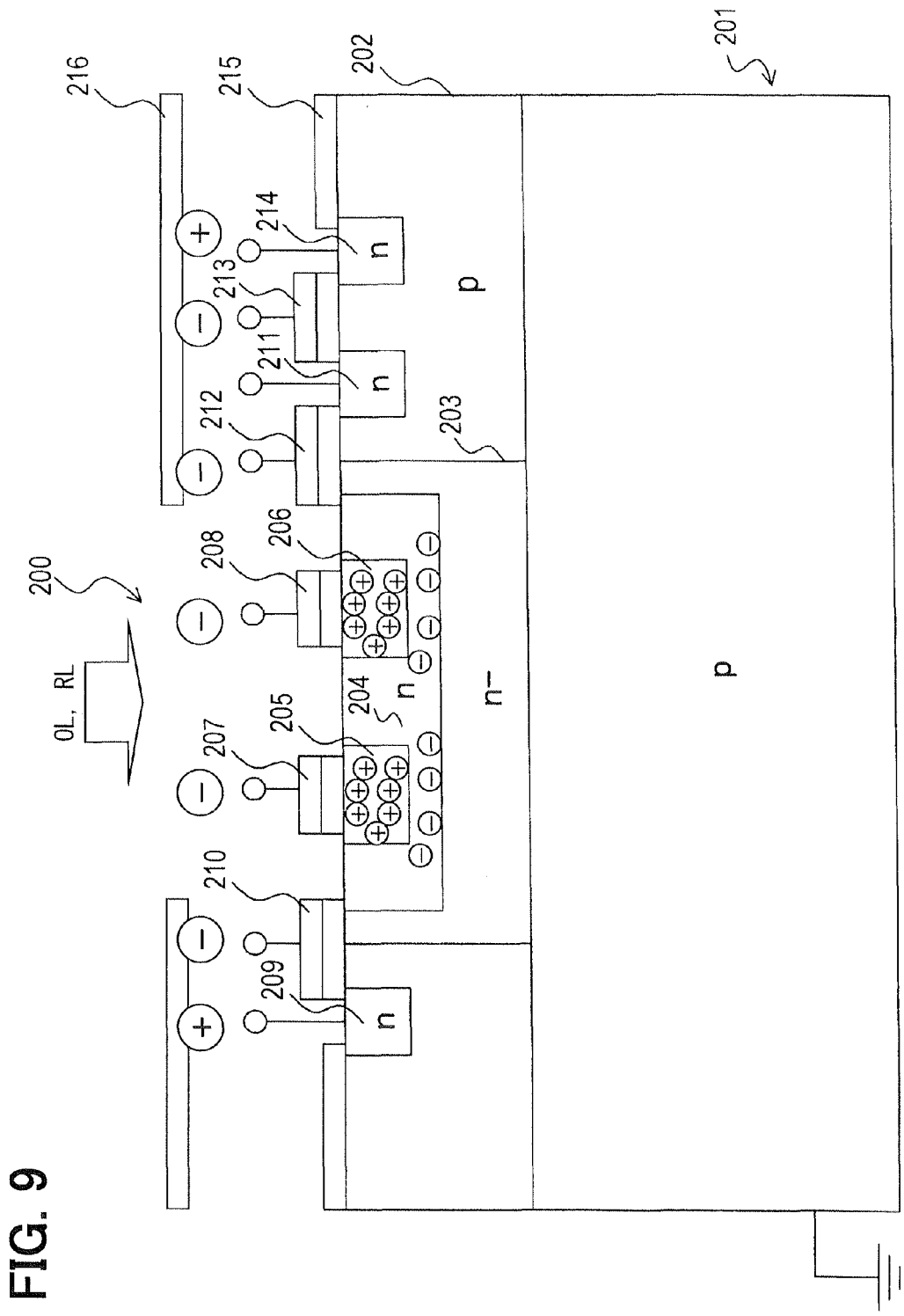
FIG. 9 is a diagram showing another state of the light detecting device according to the first embodiment.

At time t6, the reflected light of the pulse light returns after a delay of a time Td corresponding to a distance from the light source to the object M. That is, after the time t6, the outside light OL and the reflected light RL of the pulse light are input to the pixel circuits 110 and 120 as shown in FIG. 9. The reflected light RL corresponds to a signal light.

Figure 10:
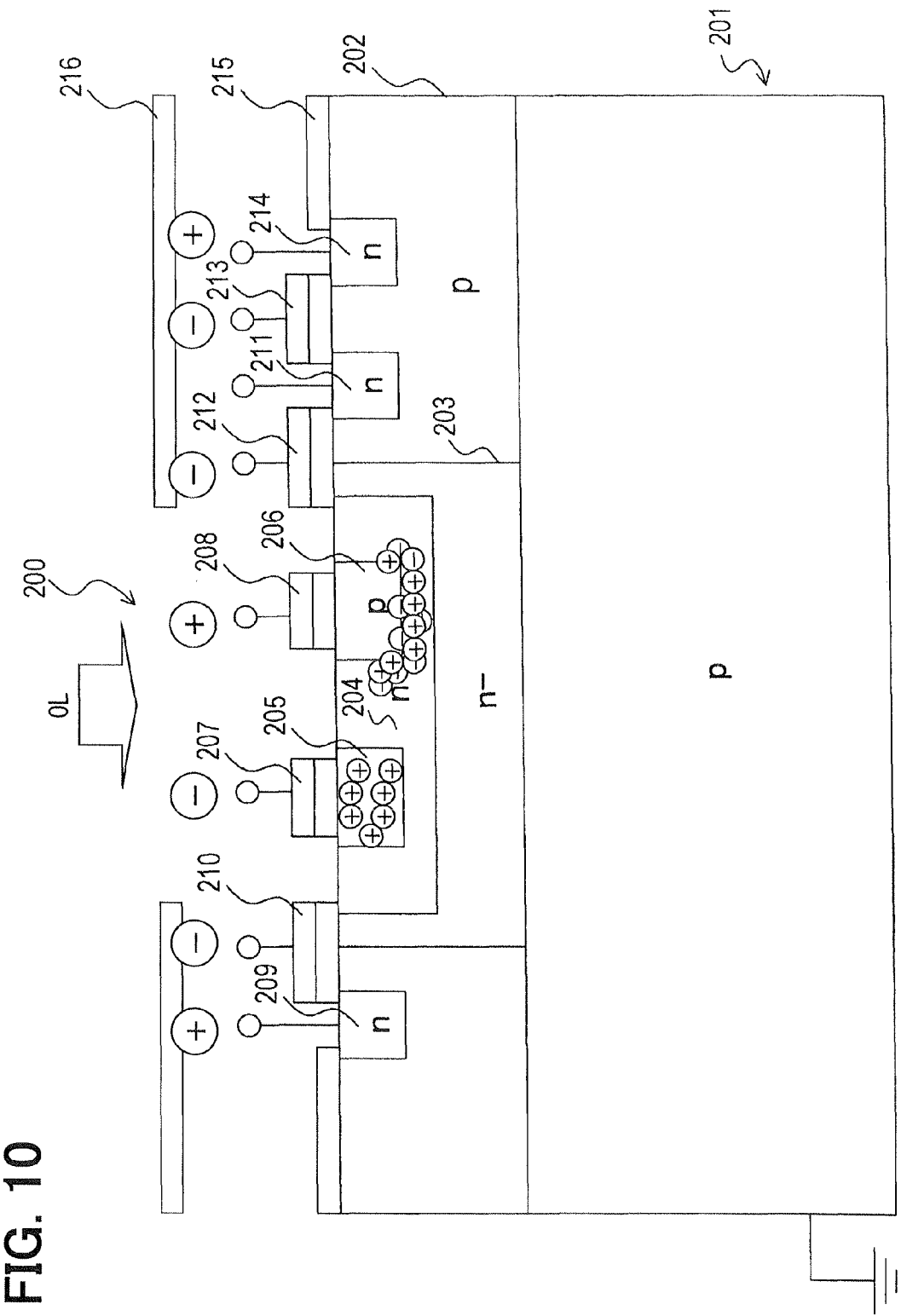
FIG. 10 is a diagram showing another state of the light detecting device according to the first embodiment.

At time t7, the light emitting signal FL is changed into the inactive level and the light emitting part 2 stops irradiating the pulse light. A time between the time t5 and the time t7 is defined as a first light-on time LT1. At the same time, the hold signal PR2 input to the pixel circuit 110 is changed to the active level. Then, in the pixel circuit 110, the holes held in the third holding region 206 and the electrons held in the first holding region 204 recombine as shown in FIG. 10.

The number of the holes generated in the third holding region 206 depends on the sum of the outside light that is input during the first light-off time OT1 and the first light-on time LT1 and a part of the reflected light that is input during the first light-on time OT1. The number of the electrons generated in the first holding region 204 depends on the sum of the outside light that is input during the first light-off time OT1 and the reflected light that is input during the first light-on time LT1. In a case where the first light-off time OT1 and the first light-on time LT1 have the same time length, the numbers of the holes and the electrons generated due to the outside light are the same. Thus, the holes and the electrons generated due to the outside light cancel out by recombination.

Figure 11:
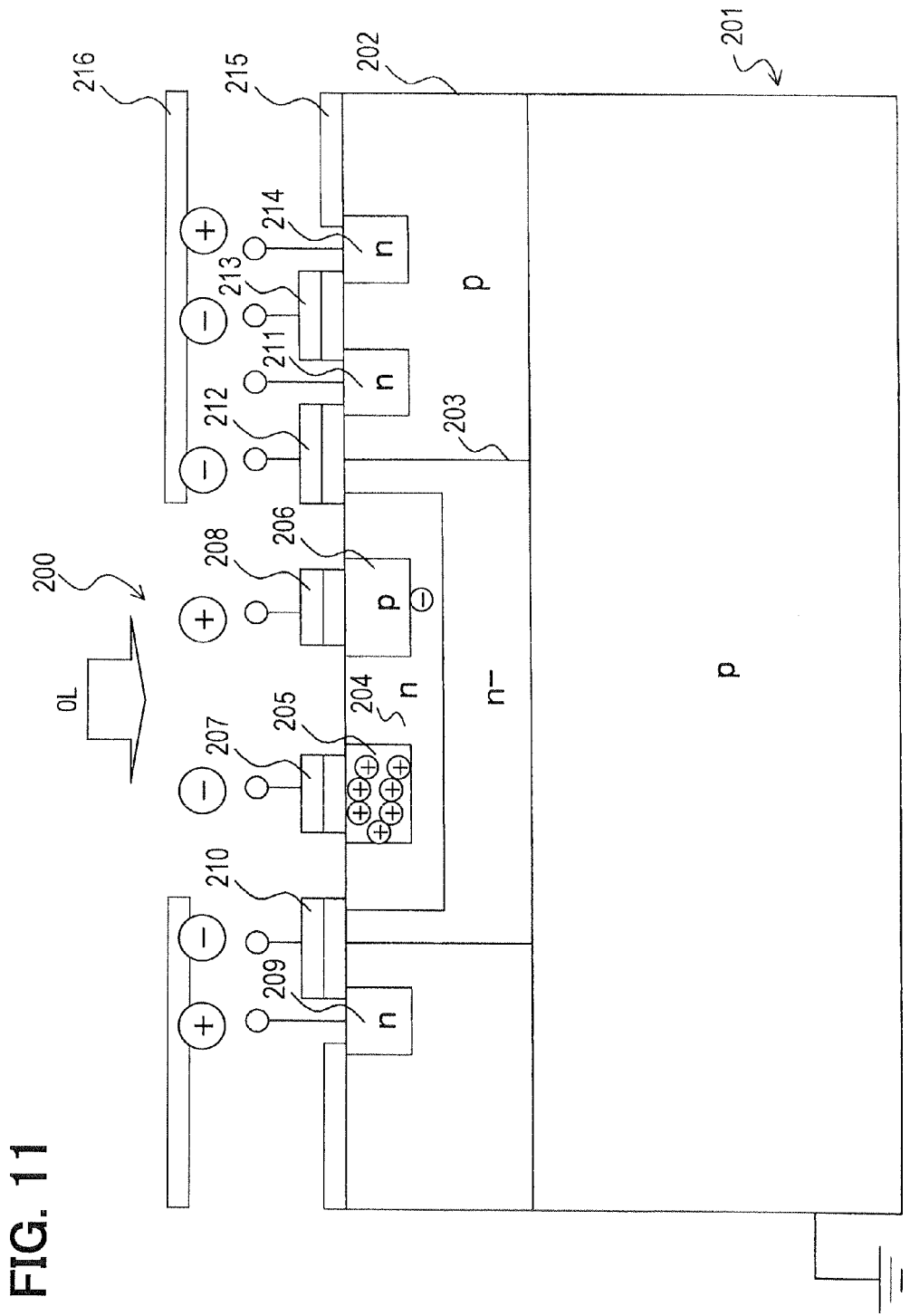
FIG. 11 is a diagram showing another state of the light detecting device according to the first embodiment.

Because a ratio of the number of the holes generated in the third holding region 206 due to the reflected light to the number of the electrons generated in the first holding region 204 due to the reflected light is 1:2, a half of the electrons generated due to the reflected light during the first light-on time LT1 remains in the first holding region 204 as shown in FIG. 11.

Furthermore, the transfer signal TG1 input to the pixel circuit 110 is changed into the active level, and the electrons held in the first holding region 204 in the pixel circuit 110 are transferred to the storing region 211 through a channel provided under the transferring electrode 212.

Figure 12:
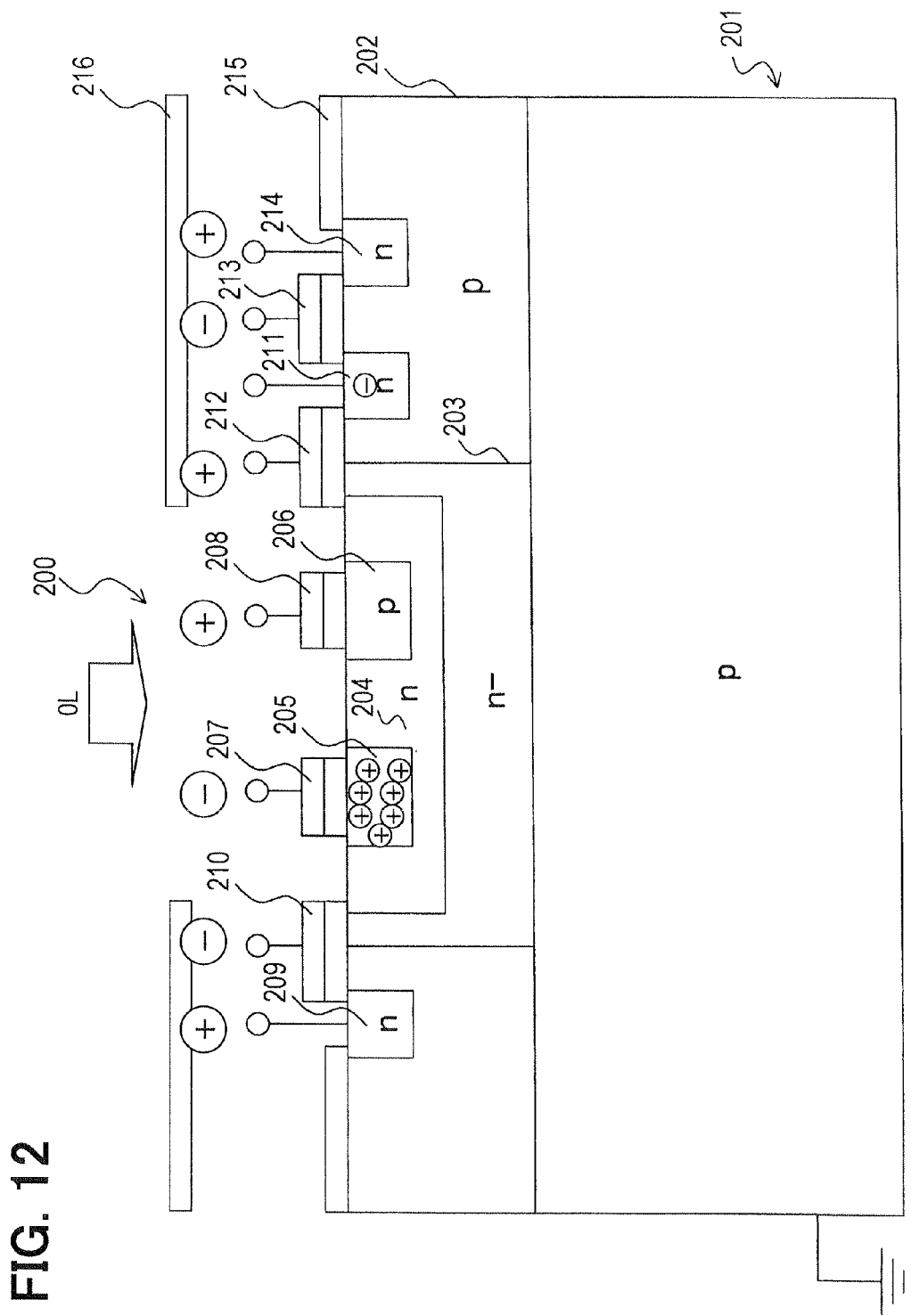
FIG. 12 is a diagram showing another state of the light detecting device according to the first embodiment.

At time t8, the transfer signal TG1 input to the pixel circuit 110 is changed into the inactive level, and the transfer of the electrons held in the first holding region 204 in the pixel circuit 110 ends as shown in FIG. 12. Furthermore, the hold signal PL1 is changed into the active level, and the holes held in the second holding region 205 are pushed to the first holding region 204 and disappear naturally.

At time t9, the reflected light of the pulse light that returns after the delay time Td depending on the distance from the light source to the object M ends. That is, after the time t9, only the outside light is input to the pixel circuits 110 and 120.

At time t10, the hold signal PR2 input to the pixel circuit 120 is changed to the active level. Then, in the pixel circuit 120, the holes stored in the third holding region 206 and the electrons held in the first holding region 204 recombine. A time between the time t5 and the time t10 is defined as a second light-on time LT2.

In a case where the sum of the second light-off time OT2 and the second light-on time LT2 are set to be larger than the sum of the first light-off time OT1, the first light-on time LT1, and the delay time Td, the reflected light of the whole pulse light returns within the second light-on time LT2. The number of holes generated in the third holding region 206 depends on the sum of the outside light that is input during the second light-off time OT2 and the second light-on time LT2 and the whole reflected light that is input during the second light-on time LT2. The number of the electrons generated in the first holding region 204 depends on the sum of the outside light that is input during the second light-on time LT2 and the whole reflected light that is input during the second light-on time LT2.

In a case where the second light-off time OT2 and the second light-on time LT2 have the same time length, the numbers of the holes and the electrons generated due to the outside light are the same. Thus, the holes and the electrons generated due to the outside light cancel out by recombination. Because a ratio of the number of the holes generated in the third holding region 206 due to the reflected light to the number of the electrons generated in the first holding region 204 due to the reflected light is 1:2, a half of the electrons generated due to the reflected light during the second light-on time LT2 remains in the first holding region 204.

Furthermore, the transfer signal TG2 input to the pixel circuit 120 is changed into the active level, and the electrons held in the first holding region 204 in the pixel circuit 120 are transferred to the storing region 211 through a channel provided under the transferring electrode 212.

At time t11, the transfer signal TG2 input to the pixel circuit 120 is changed into the inactive level, and the transfer of the electrons held in the first holding region 204 in the pixel circuit 120 ends. Furthermore, the hold signal PL2 is changed into the active level, and the holes held in the second holding region 205 are pushed to the first holding region 204 and disappear naturally.

The operation from the time t1 to the time t11 corresponds to one cycle for storing charges in the floating diffusion 117 (storing region 211) in each of the pixel circuits 110 and 120. When the image generating apparatus 1 treats a weak signal, the amount of charges for one cycle is small. Thus, the image generating apparatus 1 may repeat the operation from the time t1 to the time t11 a plurality of times to accumulate charges in the floating diffusion 117.

Figure 13:
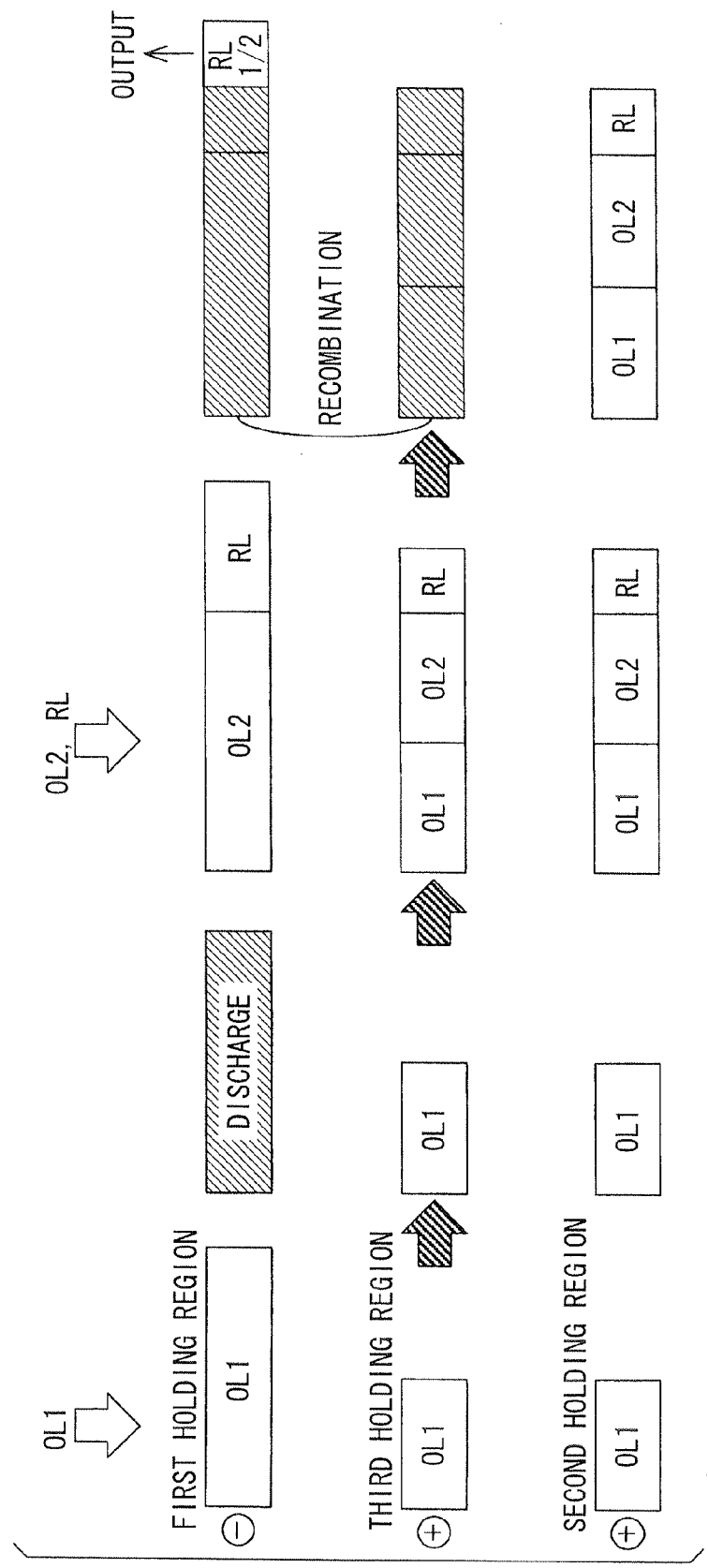
FIG. 13 is a diagram showing an operation of the light detecting device according to the first embodiment.
Figure 14:
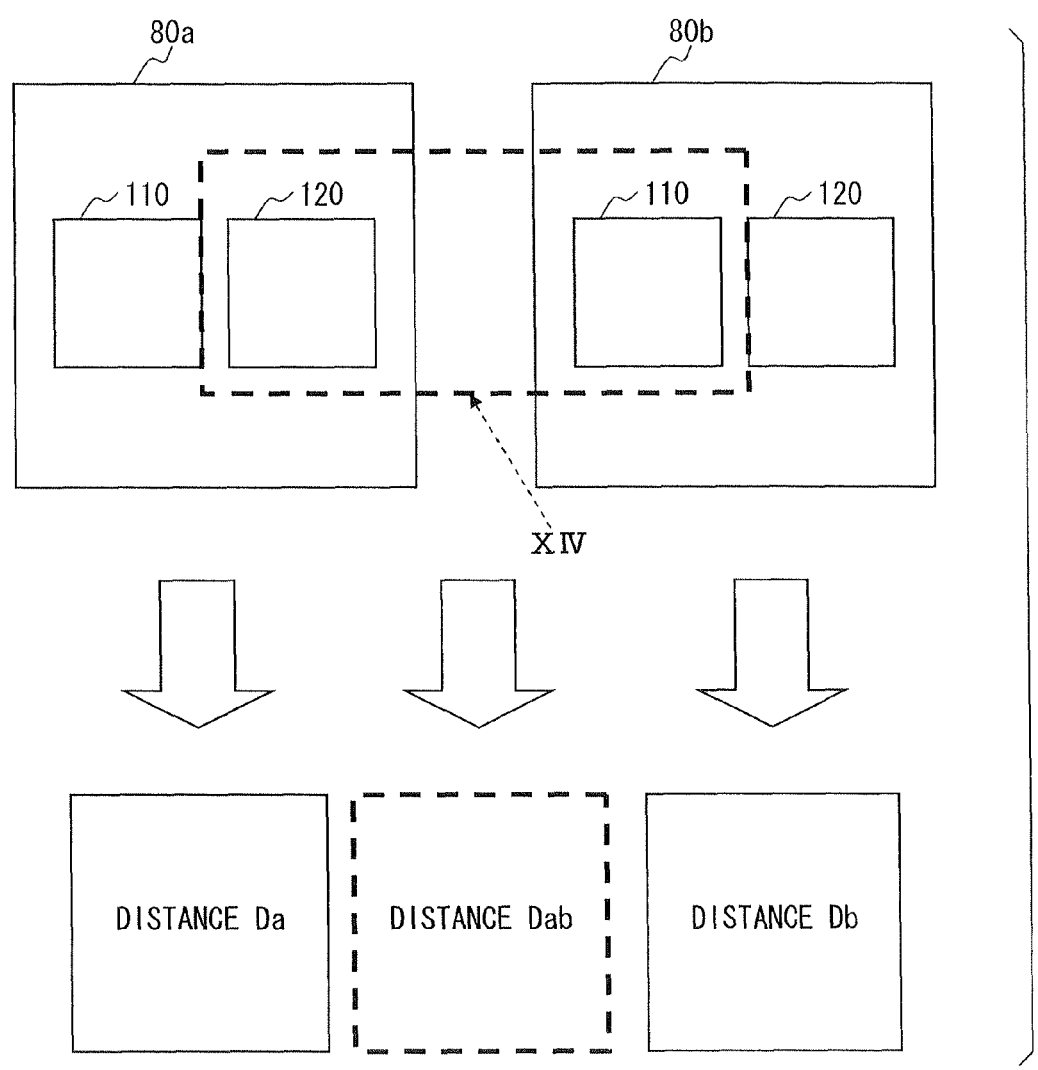
FIG. 14 is a diagram showing a method of calculating a distance to an object by using two pixel circuits arranged next to each other.

A principal part of the operation from the time t1 to the time t11 will be described with reference to FIG. 13. When the outside light OL1 is input to the photoelectric transducer 111, the electrons corresponding to the outside light OL1 are held in the first holding region 204, and the holes corresponding to the outside light OL1 are held in each of the second holding region 205 and the third holding region 206. The holes are equally divided between the second holding region 205 and the third holding region 206. Thus, the ratio of the number of charges held in the first holding region 204, the second holding region 205, and the third holding region 206, that is, the number of electrons:the number of holes:the number of holes is 2:1:1.

The electrons held in the first holding region 204 are discharged to the drain region 209 (discharging region). Thus, the ratio of charges (electrons:holes:holes) becomes 0:1:1. When the outside light OL2 and the reflected light RL are input to the photoelectric transducer 111, the electrons corresponding to the sum of the output light OL2 and the reflected light RL are held in the first holding region 204, and the holes corresponding to a half of the sum of the outside light OL2 and the reflected light RL are held in each of the second holding region 205 and the third holding region 206. Thus, the ratio of charges (electrons:holes:holes) becomes (2+RL):(2+RL/2):(2+RL/2).

The electrons held in the first holding region 204 recombine with the holes held in the third holding region 206 and the recombined charges disappear. Thus, the electrons corresponding to the half of the reflected light RL remain at a portion of the first holding region 204 in the vicinity of the third holding region 206.

The remaining electrons are transferred to the storing region 211. By the above-described operation, the charges are stored in the floating diffusion 117 in each of the pixel circuits 110 and 120. The source follower transistor 114 converts the amount of the charges stored in the floating diffusion 117 into a voltage, and the voltage is output through the row select transistor 115 as a light detection signal having voltage of V110 or V120. The voltages V110 and V120 can be expressed as values, proportional to formulas (1) and (2).

$$V110 \propto Tfl - Td \quad (1)$$

$$V120 \propto Tfl \quad (2)$$

The delay time Td of the pulse light is shorter than pulse width Tfl. The voltage V110 depends on the delay time Td of the reflected light that changes with the distance between the light source and the object M. The voltage V120 depends on the whole reflected light of the pulse light.

A distance D from the light source to the object M can be calculated according to the following equation from a light speed c, the pulse width Tfl of the light source, and the voltages V110 and V120.

$$d = c \times (Tfl/2) \times (1 - V110/V120) \quad (3)$$

The above formula (3) is calculated in the image generating part 5. The image generating part 5 includes a known microcomputer that includes a central processing unit (CPU), a read only memory (ROM), and a random access memory (RAM). The light detection signals having voltages V110 and V120 are output from the readout control circuit 82 to the image generating part 5. The image generating part 5 calculates the distance D based on the voltages V110 and V120 regardless of the amplitudes of the outside light and the reflected light of the pulse light.

In the above-described example, the transfer signals TG1 and TG2, the discharge signals DEG1 and DEG2, and the hold signals PL1, PR1, PL2, and PR2 are input to the pixel circuits 110 and 120 arranged next to each other in the horizontal direction so that a causal relationship becomes clear. The positional relationship of the pixel circuits and the order of the signals can be changed.

In the above-described example, the distance D is calculated only using the pixel circuits 110 and 120 in the two-pixel unit circuits 80. Alternatively, the readout control circuit 82 may readout the light detection signals of the pixel circuits 110 and 120 in the two-pixel unit circuits 80 arranged next to each other, and the image generating part 5 may calculate the distance D using the light detection signals.

For example, the two-pixel unit circuits 80 include two-pixel unit circuits 80*a* and 80*b* arranged next to each other. Each of the two-pixel unit circuits 80*a* and 80*b* includes pixel circuits 110 and 120. In this case, the distance D may be calculated using the pixel circuit 120 in the two-pixel unit circuit 80*a* and the pixel circuit 110 in the two-pixel unit circuit 80*b*.

The above-described operation is concurrently performed in all the two-pixel unit circuits 80 in the photoelectric sensor 8. Thus, the distance D can be calculated with accuracy using any two of the pixel circuits arranged next to each other.

When the two-pixel unit circuits 80*a* and 80*b* are used independently, distances Da and Db can be detected. When the pixel circuit 120 in the two-pixel unit circuit 80*a* and the pixel circuit 110 in the two-pixel unit circuit 80*b* surrounded by dashed line XIV are also used, the distance Dab corresponding to a position between the two-pixel unit circuits 80*a* and 80*b* can also be detected. Thus, a spatial resolution of the distance can be improved.

When the pulse light has an ideal rectangular waveform, the distance D can be calculated using formula (3) with accuracy. However, it is difficult to increase an output power of the LED or LD used as the light source without sacrificing high-speed performance due to influence of a parasitic element and a limitation of a current capability of a power MOSFET for driving the light-emitting element. Thus, the image generating part 5 may perform a compensation process of the distance D based on the rising time and the falling time of the pulse light.

The compensation process will be described below. As shown in FIG. 15A, when the pulse light has the pulse width Tfl, the pulse light actually has a rising time Tr and a falling time Tf.

The distance D can be compensated as follows. First, the waveform of the pulse light is monitored. The monitor of the waveform may be only once. The pulse width Tfl and the falling time Tf are divided into n parts at intervals of a predetermined time Δt.

A ratio of the voltages (V110/V120=an ideal value An) in a case of the ideal pulse light is calculated for each time-lag Δtn. All voltages ΔVn at the time Δtn from 0 to nth are checked.

Figure 16A:
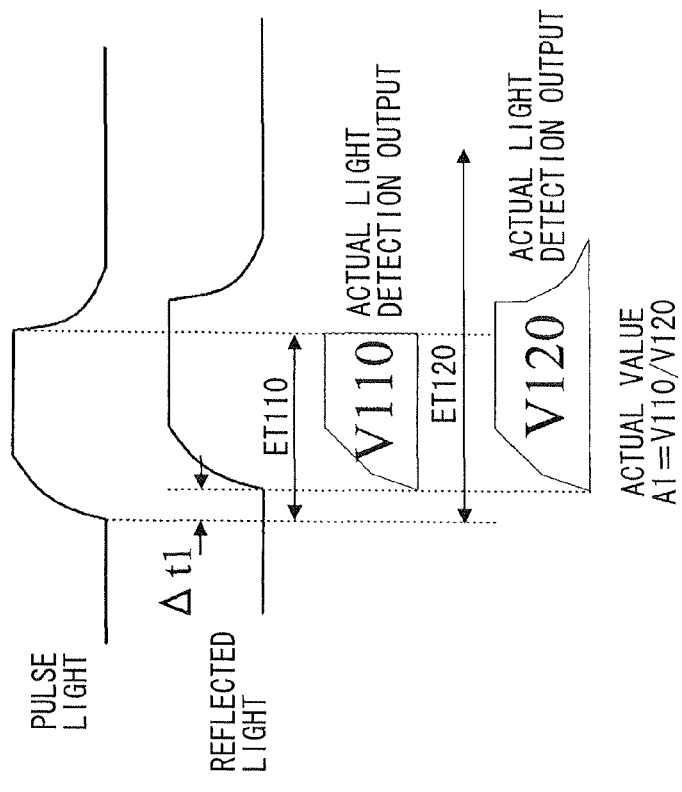
FIG. 16A and FIG. 16B are diagrams showing differences between the ideal pulse light and the actual pulse light.
Figure 16B:
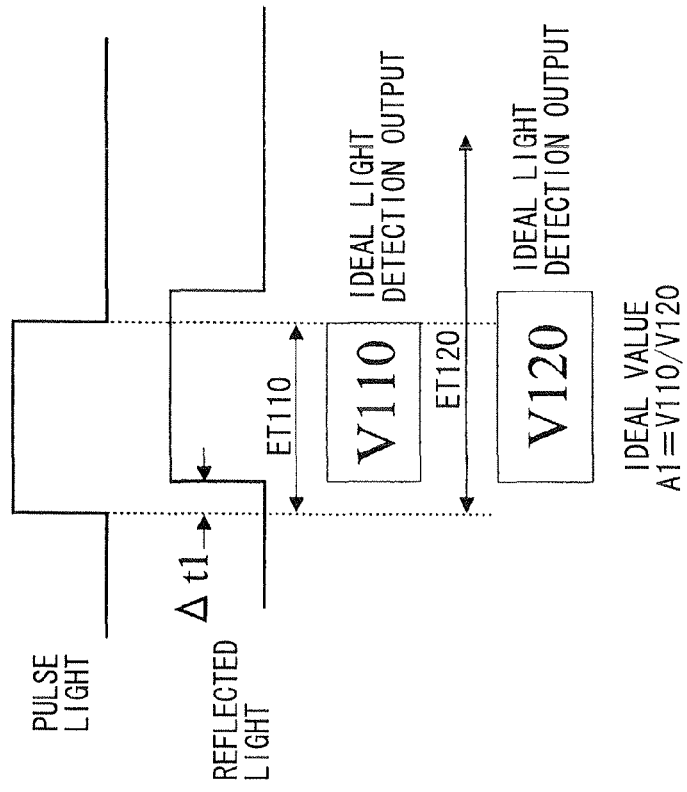

A ratio of the voltages (V110/V120=an actual value Bn) based on the detected value is calculated for each time-lag Δtn. Then, a compensation coefficient Xa=An/Bn is calculated for each time-lag Δtn and a compensation coefficient table, for example, as shown in the diagram in FIG. 15C is made. In other words, because the ideal pulse light and the actual pulse light have differences as shown in FIG. 16A and FIG. 16B, the compensation coefficient Xa for compensating the difference is calculated.

Figure 17:
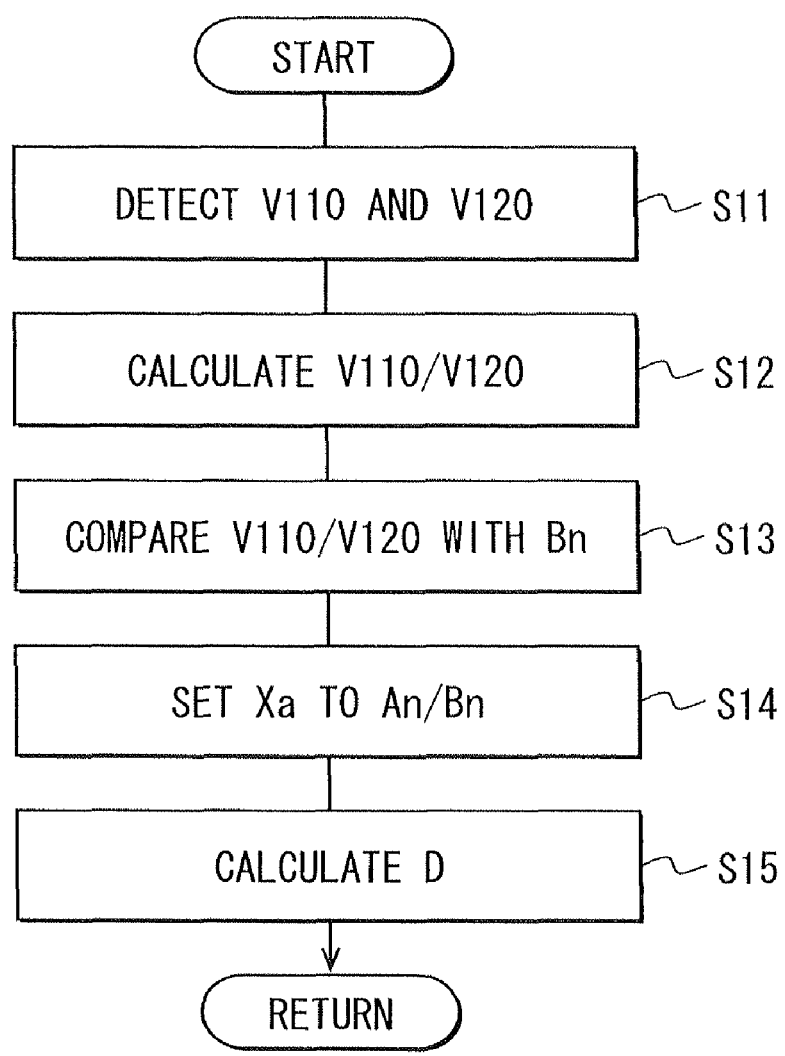
FIG. 17 is a flowchart showing a compensation process of a distance to an object.

The image generating part 5 performs the compensation process, for example, as shown in FIG. 17. At S11, the image generating part 5 detects the voltages V110 and V120.

At S12, the image generating part 5 calculates V110/V120. At S13, the image generating part 5 compares calculated V110/V120 with the actual value Bn (n=0 . . . n) in the compensation coefficient table and adopts the closest value. The closest value may be positive and negative.

At S14, the image generating part 5 sets the compensation coefficient Xa to An/Bn corresponding to the closest value Bn. At S15, the image generating part 5 calculates the distance D using formula (4).

$$D=c\times(Tfl/2)\times(1-(V110/V120)\times Xa) \quad (4)$$

In the present embodiment, one light detecting device 200 needs only one storing region 211 for detecting delay time of the pulse light. Thus, the dimension of the pixel circuit including the light detecting device 200 can be reduced.

The light detecting device 200 does not need additional storing region for storing charges due to the outside light. Thus, the dimension of the pixel circuit can be further reduced, and the light detecting device 200 can be suitably used for a high-pixel device.

Because only one output operation is required for the light-off time and the light-on time, a response time required to calculate the distance to the object can be improved. Furthermore, a time-lag of the light detection signal of the outside light component, which may be caused when a weak signal is treated, can be resolved. All the light detecting devices 200 can cancel the outside light component at substantially the same time without being affected by fluctuation of the outside light component.

The charges due to the outside light component are not transferred to the storing region 211 and only the charges due to the reflected light component are transferred to the storing region 211. Thus, the storing region 211 is difficult to be saturated, and the reflected light component can be detected even in a high-intensity outside light.

By providing two hole holding regions for one electron holding region, the ratio of electrons and holes generated by a light can be easily controlled to be 2:1 Thus, it is not necessary to strictly control a structure of an element in the light detecting device 200 (for example, a positional relationship, shapes, dimensions, and impurity concentrations of an electron holding region and a hole holding region), a difference in motilities of the electrons and the holes, and a manufacturing accuracy of the light detecting device 200. Therefore time and costs for a special process are not required, and the light detecting device 200 can be manufactured easily.

Second Embodiment

An image generating apparatus 1 according to a second embodiment of the present invention will be described below.

Because the image generating apparatus 1 according to the present embodiment has many portions in common with the image generating apparatus 1 according to the first embodiment, a description of the common portions will be omitted and different portions will be mainly described. In the first embodiment, the method of generating a range image in the distance measurement mode is described. In the present embodiment, a method of generating a normal image in an image pickup mode will be described. The method according to the present embodiment may be applied to the image generating apparatus 1 according to the first embodiment.

Figure 18:
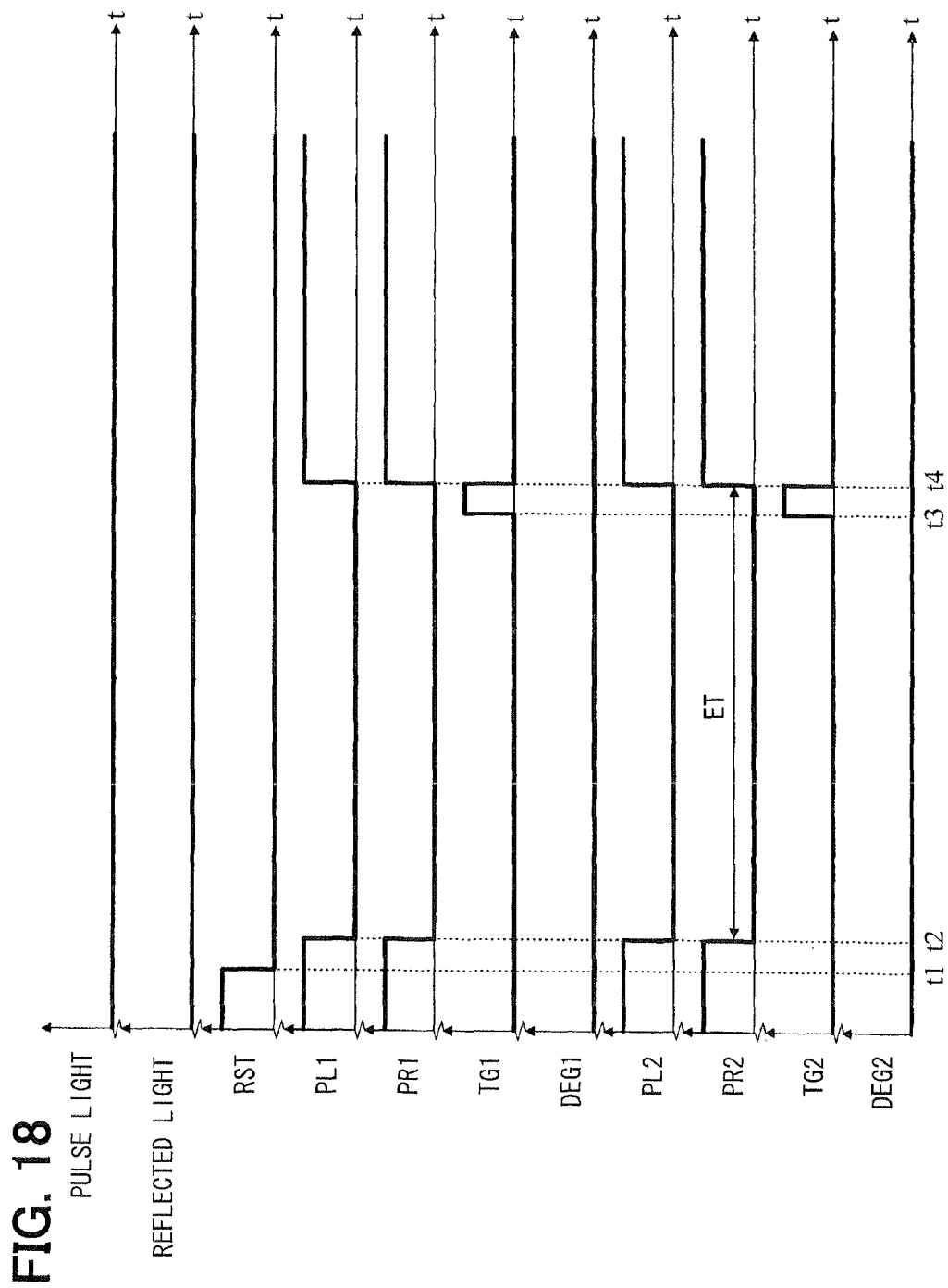
FIG. 18 is a timing chart showing signals output from a control signal generating part according to a second embodiment of the present invention.

When the image generating apparatus 1 is in the image pickup mode, the control signal generating part 4 outputs light emitting signal FL, four independent hold signals PL1, PL2, PR1, PR2, two independent transfer signals TG1, TG2, and two independent discharge signal DEG1, DEG2 through respective lines, for example, as shown in FIG. 18.

In the image pickup mode, the light emitting signal FL output from the control signal generating part 4 is kept at an inactive level and a light source does not irradiate a pulse light. Thus, electrons and holes held in the first holding region 204, the second holding region 205, and the third holding region 206 in each of the light detecting devices 200 in the pixel circuits 110 and 120 do not include electrons and holes due to a reflected light of the pulse light.

An operating timing will be described with reference to FIG. 18. First, the reset signal RST and the hold signals PL1, PL2, PR1, and PR2 are set to active level, and the discharge signals DEG1, DEG2 and the transfer signals TG1, TG2 are set to inactive level so that an electric charge stored in the storing region 211 is reset to the voltage VDD. The reset signal RST may be commonly applied to the pixel circuits 110 and 120, or the reset signal RST may be independently applied to the pixel circuits 110 and 120.

Because the hold signals PL1, PL2, PR1, and PR are at the active level, electrons generated in the first holding region 204 due to the outside light and holes generated in the second holding region 205 and the third holding region 206 due to the outside light recombine and disappear.

At time t1, the reset signal RST is changed to the inactive level, and thereby the storing region 211 becomes a floating state. The reset signal RST is changed to the inactive level at the time t1 for convenience. The reset signal RST may also be reset to the voltage VDD just before the electrons are transferred from the first holding region 204.

At time t2, the hold signals PL1, PR1, PL2, and PR2 input to the pixel circuits 110 and 120 are changed to the inactive level. Then, in each of the pixel circuits 110 and 120, holes are held in the second holding region 205 and the third holding region 206, and electrons are held in the first holding region 204 in accordance with the intensity of the outside light. A ratio of the number of the holes held in the second holding region 205, the number of the holes held in the third holding region 206, and the number of the electrons held in the first holding region 204 is 1:1:2.

At time t3, the transfer signals TG1 and TG2 input to the pixel circuits 110 and 120 are changed to the active level. Then, the electrons held in the first holding region 204 in each of the pixel circuits 110 and 120 are transferred to the storing region 211 through a channel provided under the transferring electrode 212.

At time t4, the transfer signal TG1 and TG2 input to the pixel circuits 110 and 120 are changed into the inactive level, and the transfer of the electrons held in the first holding region 204 in the pixel circuits 110 and 120 ends. Furthermore, the hold signal PL2 is changed into the active level, and the holes held in the second holding region 205 and the third holding region 206 are pushed to the first holding region 204 and disappear naturally. A time between the time t2 and the time t4 is defined as an exposure time ET.

The operation from the time t1 to the time t4 corresponds to one cycle for storing charges in the floating diffusion 117 (the storing region 211) in each of the pixel circuits 110 and 120.

By the above-described operation, the charges are stored in the floating diffusion 117 in each of the pixel circuits 110 and 120. The source follower transistor 114 converts the amount of the charges stored in the floating diffusion 117 into a voltage, and the voltage is output through the row select transistor 115 as a light detection signal.

In the above-described example, the control signal generating part 4 controls the transfer signals TG1, TG2 and the hold signals PL1, PR1, PL2, PR2 at the same time. The control signal generating part 4 may also control the transfer signals TG1, TG2 and the hold signals PL1, PR1, PL2, and PR2 at different times.

In the above-described example, the electrons generated in the first holding region 204 in each of the pixel circuits 110 and 120 are discharged to the power source having the voltage VDD through the floating diffusion 117. The electrons generated in the first holding region 204 may also be discharged to the power source having the voltage VDD through the exhaust transistor 116 (discharging electrode 210) in each of the pixel circuits 110 and 120 by changing the discharge signals DEG1 and DEG2 to the active level.

When each of the image generating apparatuses 1 according to the first embodiment and the second embodiment is in the distance measurement mode, each of the two-pixel unit circuits 80 is used as one set, the light detecting signal having the voltages V110 and V120 corresponding to the charges due to the reflected light of the pulse light are output from each of the two-pixel unit circuits 80, and range pixel values can be generated based on the voltages V110 and V120. When each of the image generating apparatuses 1 is in the image pickup mode, each of the pixel circuits 110 and 120 in the two-pixel unit circuits 80 is used independently, the light detection signal having a voltage corresponding to the charges due to the outside light is output from each of the pixel circuits 110 and 120, and the light detection signal is used as a normal pixel value. In the distance measurement mode, the pixel resolution becomes a half. However, the range image can be generated by picking up image one time. Thus, the image generating apparatuses 1 can detect a distance to an object at a high speed, and the image generating apparatuses 1 can be suitably used, for example, for detecting a distance to an object moving at a high speed.

In the image pickup mode, because each of the pixel circuits 110 and 120 is used independently, the image generating apparatuses 1 can generate a high-pixel normal image. In the conventional light detecting apparatus, because a pixel size per unit may be increased to obtain a range image, it may be difficult to arrange the large number of pixel circuits, and a pixel resolution of a normal image may be reduced. However, the light detecting devices 200 according to the first embodiment and the second embodiment can be released from the above-described issue.

If the image generating apparatuses 1 according to the first embodiment and the second embodiment are configured so that the switching signal is transmitted from the image generating part 5 to the control signal generating part 4, the distance measurement mode and the image pickup mode can be selectively switched. Thus, the light detecting device 200 according to the first embodiment and the light detecting device 200 according to the second embodiment may be provided by the same light detecting device.

Third Embodiment

An image generating apparatus 1 according to a third embodiment of the present invention will be described.

Because the image generating apparatus 1 according to the present embodiment has many portions in common with the image generating apparatus 1 according to the first embodiment, a description of the common portions will be omitted and different portions will be mainly described. In the present embodiment, a conductivity type of each portion in the light detecting device 200 according to the first embodiment shown in FIG. 5 is reversed. That is, in the light detecting device 200 according to the present embodiment, an N type semiconductor is used instead of a P type semiconductor, and a P type semiconductor is used instead of an N type semiconductor. Each component in the light detecting device 200 according to the present embodiment has the same reference number as a corresponding component in the light detecting device 200 according to the first embodiment.

Figure 19:
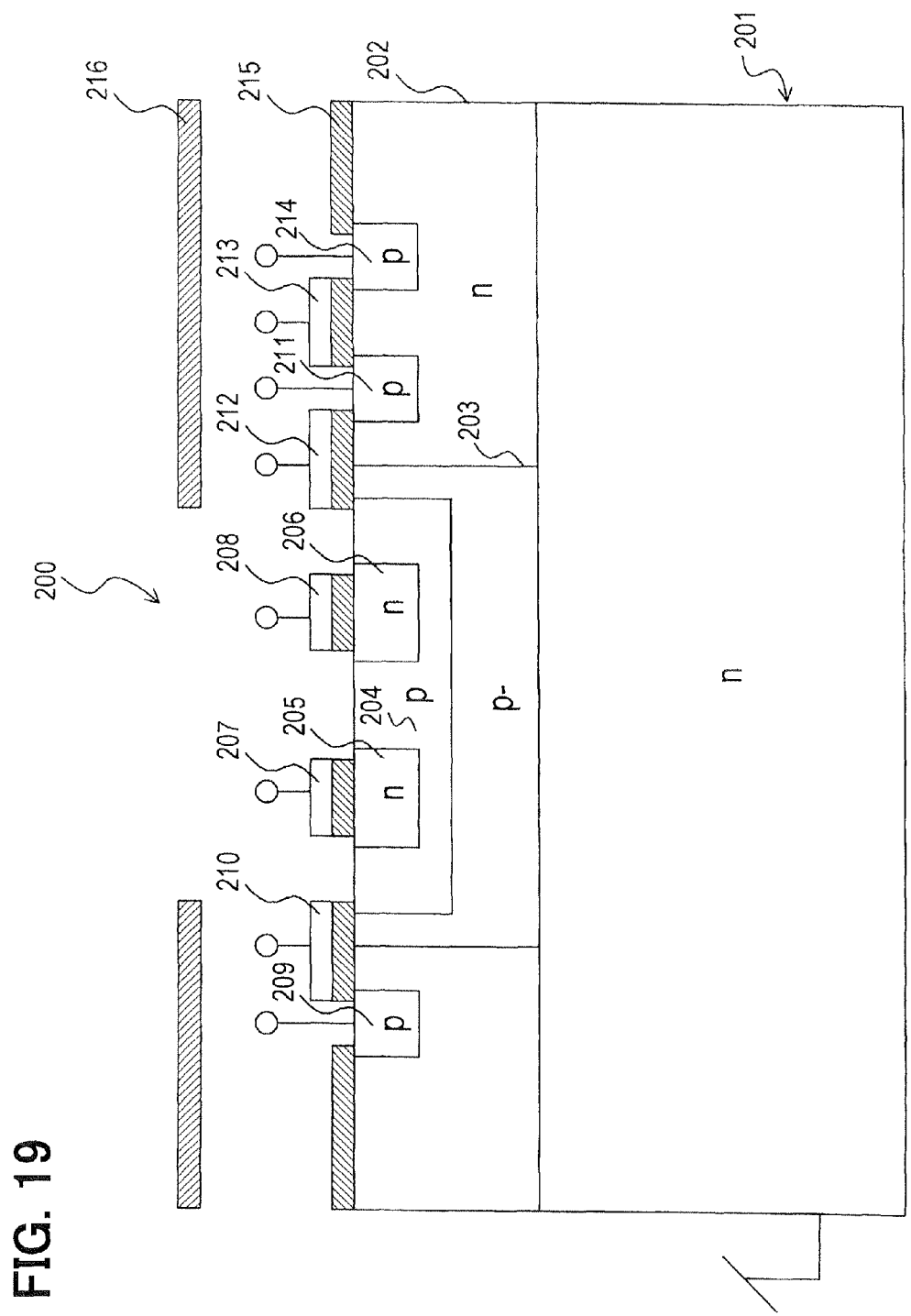
FIG. 19 is a cross-sectional view of a light detecting device according to a third embodiment of the present invention.

As shown in FIG. 19, the light detecting device 200 according to the present embodiment includes a substrate 201 made of an N conductivity type semiconductor. On a surface of the substrate 201, an element forming region 202 of the N conductivity type is disposed. In a surface portion of the element forming region 202, a well region 203 of a P-conductivity type is disposed. The well region 203 may be in contact with the surface of the semiconductor substrate 201. The element forming region 202 and the well region 203 have substantially the same thickness. In a surface portion of the well region 203, a first holding region 204 of a P conductivity type is disposed.

In a surface portion of the first holding region 204, a second holding region 205 of the N conductivity type and a third holding region 206 of the N conductivity type are disposed. The second holding region 205 and the third holding region 206 are equivalent. That is, the second holding region 205 and the third holding region 206 have the same dimension (for example, planar shape and width). On the second holding region 205 and the third holding region 206, a first control electrode 207 and a second control electrode 208 are disposed, respectively, through an insulating layer 215. The insulating layer 215 is made of an oxide layer such as a silicon oxide layer. The insulating layer 215 is light-permeable. The first control electrode 207 and the second control electrode 208 have the same dimension and are light-permeable. The first control electrode 207 is coupled with the line of the hold signal PL, and the second control electrode 208 is coupled with the line of the hold signal PR. Above the element forming region 202 except for the well region 203, a shielding layer 216 is disposed.

Figure 20:
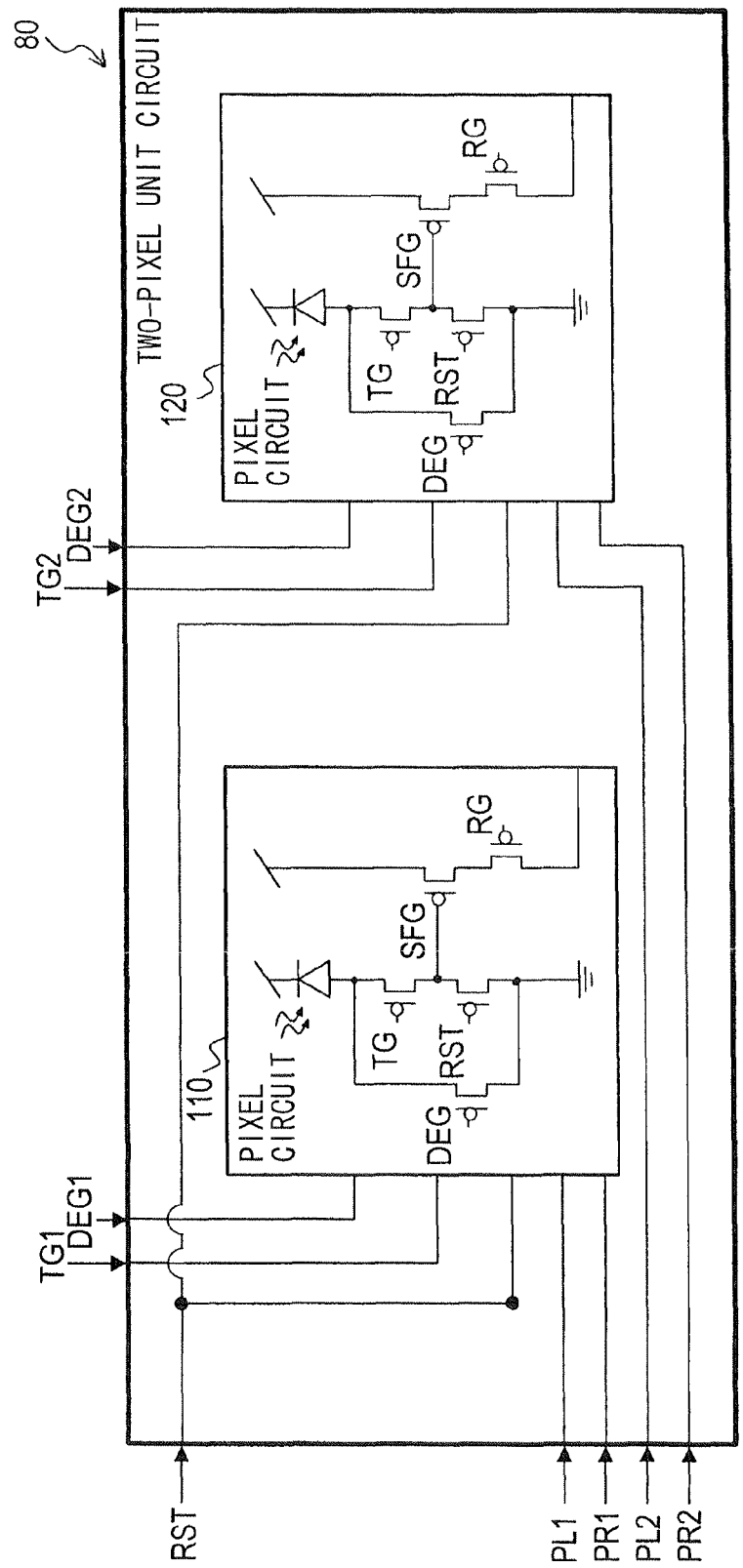
FIG. 20 is a diagram showing a two-pixel unit circuit according to the third embodiment.
Figure 21:
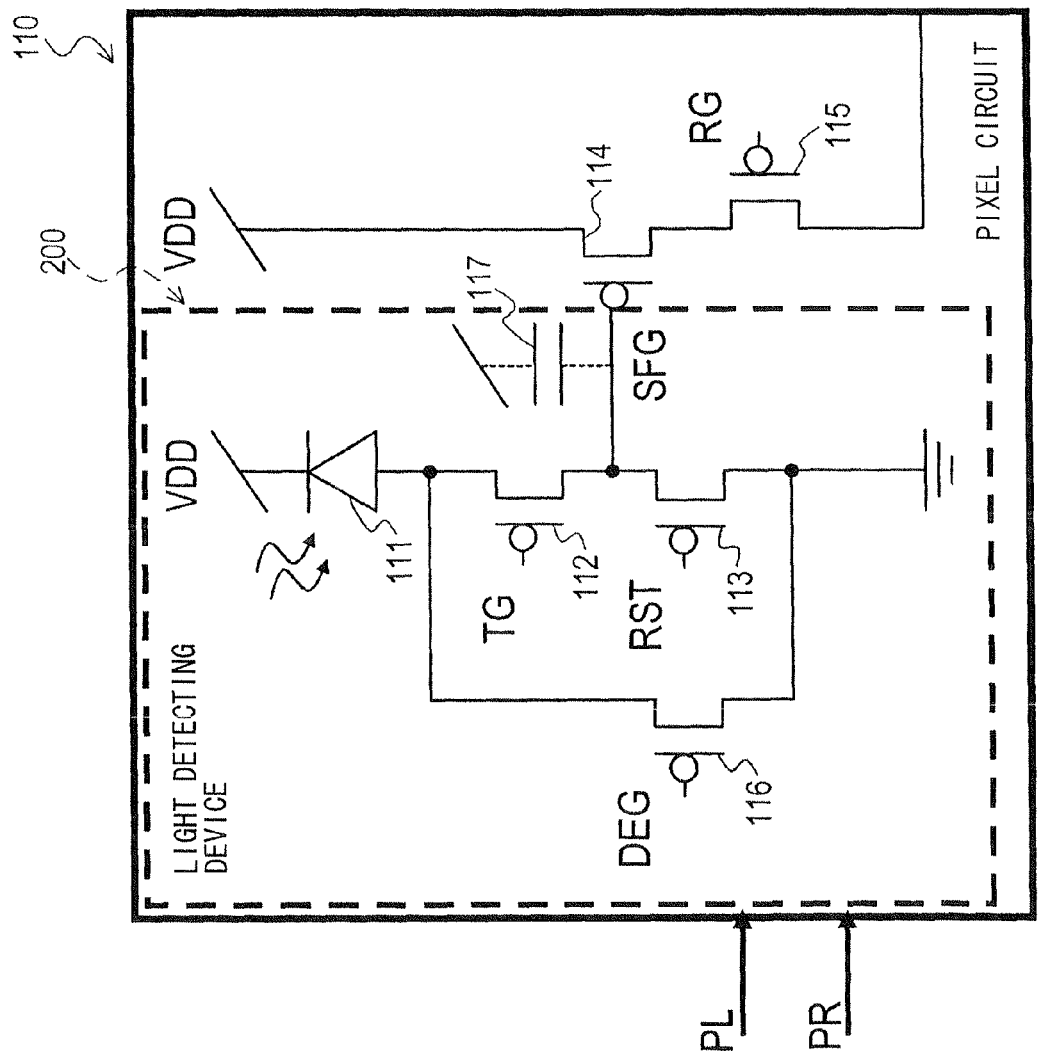
FIG. 21 is a circuit diagram showing a pixel circuit according to the third embodiment.

When the conductivity types in the light detecting device 200 are reversed, configurations of the two-pixel unit circuit 80, the pixel circuits 110 and 120 are also changes from those of the first embodiment shown in FIG. 3 and FIG. 4, and the NMOS transistor is changed into a PMOS transistor as shown in FIG. 20 and FIG. 21. Since the pixel circuits 110 and 120 have substantially the same configuration, the configuration of the pixel circuit 110 will be described with reference to FIG. 21 on behalf of the pixel circuits 110 and 120.

As shown in FIG. 21, the pixel circuit 110 includes a photoelectric transducer 111, a transfer transistor 112, a reset transistor 113, a source follower transistor 114, a row select transistor 115, an exhaust transistor 116, and a floating diffusion 117. An anode side of the photoelectric transducer 111 is coupled with the power source having the voltage VDD. A cathode side of the photoelectric transducer 111 is coupled with a source of the transfer transistor 112. A drain of the transfer transistor 112 is coupled with a source of the reset transistor 113 and a gate of the source follower transistor 114. A drain of the reset transistor 113 is coupled with the ground GND. A source of the source follower transistor 114 is coupled with the power source having the voltage VDD. A drain of the source follower transistor 114 is coupled with a source of the row select transistor 115. The cathode side of the photoelectric transducer 111 is also coupled with a source of the exhaust transistor 116. A drain of the exhaust transistor 116 is coupled with the ground GND.

Because the electrons and the holes have polarities, the voltage operations of the signal applied to the electrodes are also reversed from those of the first embodiment and the second embodiment. That is, the active level is changed into the inactive level, the inactive level is changed into the active level, the voltage VDD is changed into the ground GND, and the ground GND is changed into the voltage VDD. The image generating apparatus 1 according to the present embodiment can have similar effects as the image generating apparatus 1 according to the first embodiment.

Although the present invention has been fully described in connection with the preferred embodiments thereof with reference to the accompanying drawings, it is to be noted that various changes and modifications will become apparent to those skilled in the art.

What is claimed is:

1. A light detecting device comprising:
a semiconductor substrate having a first conductivity type;
an element forming region disposed on a surface of the semiconductor substrate and having the first conductivity type;
a well region disposed in a surface portion of the element forming region and having a second conductivity type;
a first holding region disposed in a surface portion of the well region, having the second conductivity type, and configured to hold a first carrier generated in the well region, the first carrier being one of an electron and a hole;
a second holding region and a third holding region disposed in a surface portion of the first holding region, each of the second holding region and the third holding region having the first conductivity type, each of the second holding region and the third holding region configured to hold a second carrier generated in the well region, the second carrier being the other one of the electron and the hole;
a storing region disposed in the surface portion of the element forming region, having the second conductivity type, and configured to store the first carrier;
a discharging region disposed in the surface portion of the element forming region, having the second conductivity type, and configured to be used for discharging the first carrier;
an insulating layer being light-permeable and disposed on the second holding region and the third holding region;
a first control electrode being light-permeable, disposed on the second holding region through the insulating layer, and configured to control holding of the second carrier in the second holding region;
a second control electrode being light-permeable, disposed on the third holding region through the insulating layer, and configured to control holding of the second carrier in the third holding region;
a transferring electrode being in contact with the well region and the storing region and configured to control transferring of the first carrier or the second carrier between the well region and the storing region;
a discharging electrode being in contact with the well region and the discharging region and configured to control transferring of the first carrier or the second carrier between the well region and the discharging region; and
a resetting electrode being in contact with the storing region and the discharging region and configured to control transferring of the first carrier and the second carrier between the storing region and the discharging region.

2. The light detecting device according to claim 1, wherein the second holding region and the third holding region have a same dimension.

3. The light detecting device according to claim 1, wherein the first control electrode and the second control electrode have a same dimension.

4. The light detecting device according to claim 1, wherein the first conductivity type is one of a P conductivity type and an N conductivity type, and the second conductivity type is the other one of the P conductivity type and the N conductivity type.

5. The light detecting device according to claim 1, wherein the well region is in contact with the surface of the semiconductor substrate.

6. An apparatus including a plurality of the light detecting devices according to claim 1, the plurality of the light detecting devices arranged one dimensionally or two dimensionally.

7. A method of controlling the light detecting device according to claim 1, comprising:
controlling the first control electrode and the second control electrode so that in a plurality of first carriers and a plurality of second carriers generated in the well region during a light-off time of a light source, the plurality of first carriers is held in the first holding region and the plurality of second carriers is divided equally between the second holding region and the third holding region;
reversing the discharging electrode so that the plurality of first carriers is completely discharged from the first holding region to the discharging region;
reversing the discharging electrode;
controlling the first control electrode and the second control electrode so that in a plurality of first carriers and a plurality of second carriers generated in the well region during a light-on time of the light source, the plurality of first carriers is held in the first holding region and the plurality of second carriers is equally divided between the second holding region and the third holding region;

reversing only one of the first control electrode and the second control electrode so that a part of the plurality of first carriers held in the first holding region recombine with the plurality of second carriers held in one of the second holding region and the third holding region on which the one of the first control electrode and the second control electrode is disposed;

reversing the transferring electrode so that the other part of the plurality of first carriers remaining in the first holding region is completely transferred from the first holding region to the storing region; and outputting a light detection signal in accordance with the other part of the plurality of first carriers stored in the storing region.

8. The method according to claim 7, wherein
the plurality of first carriers generated in the well region is held in the first holding region, and
the plurality of second carriers generated in the well region is held in at least one of the second holding region and the third holding region.

9. The method according to claim 7, wherein
the controlling the first control electrode and the second control electrode so that the plurality of second carriers is divided equally between the second holding region and the third holding region includes applying a same voltage to the first control electrode and the second control electrode so that a same number of second carriers are generated in the second holding region and the third holding region in accordance with a light.

10. The method according to claim 7, wherein
the one of the first control electrode and the second control electrode are controlled so that the plurality of second carriers held in the one of the second holding region and the third holding region recombine with the part of the plurality of first carriers held in the first holding region.

11. The method according to claim 7, wherein
the light-off time and the light-on time are set to have a same time length so that the other part of the plurality of first carriers that remain in the first holding region after the part of the plurality of first carriers held in the first holding region during the light-on time recombine with the plurality of second carriers held in the one of the second holding region and the third holding region during the light-off time and the light-on time becomes a half of the plurality of first carriers generated during the light-on time.

12. A method of controlling the light detecting device according to claim 1, comprising:
setting a light-off time and a light-on time of a light source to have a same time length;
applying a same voltage to the first control electrode and the second control electrode so that in a plurality of first carriers and a plurality of second carriers generated in the well region during the light-off time in accordance with an intensity of an outside light, the plurality of first carriers is held in the first holding region and the plurality of second carriers is divided equally between the second holding region and the third holding region;
reversing a voltage applied to the discharging electrode so that the plurality of first carriers is completely discharged from the first holding region to the discharging region;
reversing the voltage applied to the discharging electrode;
applying a same voltage to the first control electrode and the second control electrode so that in a plurality of first carriers and a plurality of second carriers generated in the well region during the light-on time in accordance with the intensity of the outside light and an intensity the light source, the plurality of first carriers is held in the first holding region and the plurality of second carriers is divided equally between the second holding region and the third holding region;
reversing the voltage applied to only one of the first control electrode and the second control electrode so that a part of the plurality of first carriers held in the first holding region during the light-on time in accordance with the intensity of the outside light and the intensity of the light source recombine with the plurality of second carriers held in one of the second holding region and the third holding region, on which the one of the first electrode and the second electrode is disposed, during the light-off time and the light-on time in accordance with the intensity of the outside light and the intensity of the light source, and a half of the plurality of first carriers that is generated during the light-on time in accordance with the intensity of the light source remains in the first holding region;
reversing a voltage applied to the transferring electrode so that the half of the plurality of first carriers remaining in the first holding region is completely transferred from the first holding region to the storing region; and
outputting a light detection signal in accordance with the half of the plurality of first carriers stored in the storing region.

13. A method of controlling an apparatus including a pair of the light detecting devices according to claim 1, the pair of the light detecting devices including a first light detecting device and a second light detecting device arranged next to each other, the method of controlling the apparatus including a method in a distance measurement mode for measuring a distance from a light source to an object, the method in the distance measurement mode comprising:
applying a same voltage to the first electrode and the second electrode in the first light detecting device so that in a plurality of first carriers and a plurality of second carriers generated in the well region during a first light-off time of the light source in accordance with an intensity of an outside light, the plurality of first carriers is held in the first holding region and the plurality of second carriers is divided equally between the second holding region and the third holding region;
applied to the discharging electrode in the first light detecting device so that the plurality of first carriers is completely discharged from the first holding region to the discharging region;
reversing the voltage applied to the discharging electrode in the first light detecting device;
irradiating a pulse light from the light source in a first light-on time;
applying a same voltage to the first control electrode and the second control electrode in the first light detecting device so that in a plurality of first carriers and a plurality of second carriers generated in the well region during the first light-on time in accordance with the intensity of the outside light and an intensity of a reflected light of the pulse light from the object, the plurality of first carriers is held in the first holding region and the plurality of second carriers is divided equally between the second holding region and the third holding region;
reversing the voltage applied to only one of the first control electrode and the second control electrode in the first light detecting device so that a part of the plurality of first carriers held in the first holding region during the first light-on time in accordance with the intensity of the outside light and the intensity of the reflected light recombine with the plurality of second carriers held in one of the second holding region and the third holding region, on which the one of the first electrode and the second electrode is disposed, during the first light-off time and the first light-on time in accordance with the intensity of the outside light and the intensity of the reflected light, and a half of the plurality of first carriers that is generated during the first light-on time in accordance with the intensity of the reflected light remains in the first holding region;

reversing a voltage applied to the transferring electrode in the first light detecting device so that the half of the plurality of first carriers remaining in the first holding region is completely transferred from the first holding region to the storing region;

outputting a first light detection signal in accordance with the half of the plurality of first carriers stored in the storing region;

applying a same voltage to the first electrode and the second electrode in the second light detecting device so that in a plurality of first carriers and a plurality of second carriers generated in the well region during a second light-off time of the light source in accordance with the intensity of the outside light, the plurality of first carriers is held in the first holding region and the plurality of second carriers is divided equally between the second holding region and the third holding region;

reversing a voltage applied to the discharging electrode in the second light detecting device so that the plurality of first carriers is completely discharged from the first holding region to the discharging region;

reversing the voltage applied to the discharging electrode in the second light detecting device;

irradiating the pulse light from the light source in a second light-on time;

applying a same voltage to the first control electrode and the second control electrode in the second light detecting device so that in a plurality of first carriers and a plurality of second carriers generated in the well region during the second light-on time in accordance with the intensity of the outside light and the intensity of the reflected light, the plurality of first carriers is held in the first holding region and the plurality of second carriers is divided equally between the second holding region and the third holding region;

reversing the voltage applied to only, one of the first control electrode and the second control electrode in the second light detecting device so that a part of the plurality of first carriers held in the first holding region during the second light-on time in accordance with the intensity of the outside light and the intensity of the reflected light recombine with the plurality of second carriers held in one of the second holding region and the third holding region, on which the one of the first electrode and the second electrode is disposed, during the second light-off time and the second the light-on time in accordance with the intensity of the outside light and the intensity of the reflected light, and a half of the plurality of first carriers that is generated during the second light-on time in accordance with the intensity of the reflected light remains in the first holding region;

reversing a voltage applied to the transferring electrode in the second light detecting device so that the half of the plurality of first carriers remaining in the first holding region is completely transferred from the first holding region to the storing region;

outputting a second light detection signal in accordance with the half of the plurality of first carriers stored in the storing region; and calculating the distance from the light source to the object based on the first light detection signal and the second light detection signal.

14. The method according to claim 13, wherein:

the first light-off time, the first light-on time, and the pulse light have a first time length;

the second light-off time and the second light-on time have a second time length; and the second time length is longer than the first time length.

15. The method according to claim 13, further comprising a method in an image pickup mode for picking up an image of the object, the method in the image pickup mode comprising:

applying a same voltage to the first control electrode and the second control electrode in each of the first light detecting device and the second light detecting device so that in a plurality of first carriers and a plurality of second carriers generated in the well region during a light-off time of the light source in accordance with the intensity of the outside light, the plurality of first carriers is held in the first holding region and the plurality of second carriers is equally divided into the second holding region and the third holding region;

reversing the voltage applied to the transferring electrode in each of the first light detecting device and the second light detecting device so that the plurality of first carriers held in the first holding region is completely transferred from the first holding region to the storing region; and outputting a light detection signal in accordance with the plurality of first carriers stored in the storing region.

16. The method according to claim 15, wherein the distance measurement mode and the image pickup mode are selectively switchable.

* * * * *